United States Patent
Logue et al.

(10) Patent No.: US 7,564,283 B1
(45) Date of Patent: Jul. 21, 2009

(54) AUTOMATIC TAP DELAY CALIBRATION FOR PRECISE DIGITAL PHASE SHIFT

(75) Inventors: John D. Logue, Placerville, CA (US); Alvin Y. Ching, San Jose, CA (US); Wei Guang Lu, San Jose, CA (US)

(73) Assignee: XILINX, Inc., San Jose, CA (US)

( * ) Notice: Subject to any disclaimer, the term of this patent is extended or adjusted under 35 U.S.C. 154(b) by 1150 days.

(21) Appl. No.: 10/837,059

(22) Filed: Apr. 30, 2004

Related U.S. Application Data

(63) Continuation-in-part of application No. 09/684,540, filed on Oct. 6, 2000, now Pat. No. 6,775,342, which is a continuation-in-part of application No. 09/102,740, filed on Jun. 22, 1998, now Pat. No. 6,289,068.

(51) Int. Cl.
  *H03L 7/06* (2006.01)
  *H03H 11/16* (2006.01)
(52) U.S. Cl. .................................... 327/234; 327/158
(58) Field of Classification Search ......... 327/231–238, 327/241, 243, 244
  See application file for complete search history.

(56) References Cited

U.S. PATENT DOCUMENTS

| | | | |
|---|---|---|---|
| 5,068,628 A | 11/1991 | Ghoshal | |
| 5,283,631 A | 2/1994 | Koerner et al. | |
| 5,463,337 A | 10/1995 | Leonowich | |
| 5,465,076 A | 11/1995 | Yamauchi et al. | |
| 5,489,864 A | 2/1996 | Ashuri | |
| 5,511,100 A | 4/1996 | Lundberg et al. | |
| 5,631,920 A | 5/1997 | Hardin | |
| 5,644,262 A | 7/1997 | Bazes | |
| 5,646,564 A | 7/1997 | Erickson et al. | |
| 5,712,884 A | 1/1998 | Jeong | |
| 5,714,907 A | 2/1998 | Bazes | |
| 6,400,735 B1 | 6/1998 | Percey | |
| 5,790,612 A | 8/1998 | Chengson et al. | |
| 5,796,673 A | 8/1998 | Foss et al. | |
| 5,805,003 A | 9/1998 | Hsu | |

(Continued)

FOREIGN PATENT DOCUMENTS

EP  0655840 A2  11/1994

(Continued)

OTHER PUBLICATIONS

U.S. Appl. No. 09/684,528, filed Oct. 6, 2000, Percey et al.

(Continued)

*Primary Examiner*—Lincoln Donovan
*Assistant Examiner*—Thomas J Hiltunen
(74) *Attorney, Agent, or Firm*—E. Eric Hoffman; Robert M. Brush

(57) ABSTRACT

An automatic calibration scheme is provided, which calibrates the equivalent taps per period ETT/P every time a delay lock loop is used. More specifically, a digital phase shifter is used to measure equivalent taps per period ETT/P. Alternately, the digital phase shifter is used to directly measure the signal delay through a clock phase shifter of the delay lock loop, thereby directly determining the high frequency and low frequency overhead constants.

24 Claims, 23 Drawing Sheets

U.S. PATENT DOCUMENTS

| | | | |
|---|---|---|---|
| 5,963,074 | A | 10/1999 | Arkin |
| 5,969,553 | A | 10/1999 | Kishi et al. |
| 5,990,714 | A | 11/1999 | Takahashi |
| 6,014,063 | A | 1/2000 | Liu et al. |
| 6,043,717 | A | 3/2000 | Kurd |
| 6,052,011 | A | 4/2000 | Dasgupta |
| 6,073,259 | A | 6/2000 | Sartschev et al. |
| 6,101,197 | A | 8/2000 | Keeth et al. |
| 6,104,223 | A | 8/2000 | Chapman et al. |
| 6,125,157 | A | 9/2000 | Donnelly et al. |
| 6,144,242 | A | 11/2000 | Jeong et al. |
| 6,150,862 | A | 11/2000 | Vikinski |
| 6,151,356 | A | 11/2000 | Spagnoletti et al. |
| 6,184,753 | B1 | 2/2001 | Ishimi et al. |
| 6,188,288 | B1 | 2/2001 | Ragan et al. |
| 6,194,930 | B1 | 2/2001 | Matsuzaki et al. |
| 6,289,068 | B1 | 9/2001 | Hassoun et al. |
| 6,292,040 | B1 | 9/2001 | Iwamoto et al. |
| 6,327,318 | B1 * | 12/2001 | Bhullar et al. ............ 375/374 |
| 6,356,122 | B2 | 3/2002 | Sevalia et al. |
| 6,400,180 | B2 | 6/2002 | Wittig et al. |
| 6,445,234 | B1 | 9/2002 | Yoon et al. |
| 6,487,648 | B1 | 11/2002 | Hassoun |
| 6,501,309 | B1 | 12/2002 | Tomita |
| 6,539,072 | B1 | 3/2003 | Donnelly et al. |
| 6,557,110 | B2 | 4/2003 | Sakamoto et al. |
| 6,587,534 | B2 | 7/2003 | Hassoun et al. |
| 6,600,771 | B1 | 7/2003 | Moon et al. |
| 6,625,242 | B1 | 9/2003 | Yoo et al. |
| 6,633,288 | B2 | 10/2003 | Agarwal et al. |
| 6,775,342 | B1 | 8/2004 | Young et al. |
| 7,010,014 | B1 | 3/2006 | Percey |
| 7,157,951 | B1 | 1/2007 | Morrison et al. |

FOREIGN PATENT DOCUMENTS

| | | |
|---|---|---|
| EP | 0704975 A1 | 4/1996 |
| JP | 5-191233 | 7/1993 |
| JP | 07-202655 | 4/1995 |
| JP | 07201136 | 8/1995 |
| JP | 8-97715 | 4/1996 |
| JP | 09009285 | 1/1997 |
| WO | WO 91/12666 | 8/1991 |
| WO | WO97/40576 | 10/1997 |
| WO | WO99/14759 | 3/1999 |
| WO | WO 99/67882 | 12/1999 |
| WO | WO 99/67882 A1 | 12/1999 |

OTHER PUBLICATIONS

Hiroki Sutoh et al., A Clock Distribution Technique with an Automatic Skew Compensation Circuit, IEICE Transactions on Electronics, Institute of Electronics Information and Commercial Engineering, vol. E81-C., No. 2, Feb. 1, 1998, pp. 277-283, Tokyo, JP.

U.S. Appl. No. 10/792,055, filed Mar. 2, 2004, Lu.

U.S. Appl. No. 10/618,404, filed Jul. 11, 2003, Young.

U.S. Appl. No. 09/684,529, filed Oct. 6, 2000, Logue et al.

U.S. Appl. No. 09/684,540, filed Oct. 6, 2000, Young et al.

U.S. Appl. No. 10/837,210, filed Apr. 30, 2004, Percey et al.

U.S. Appl. No. 10/837,324, filed Apr. 30, 2004, Pang et al.

U.S. Appl. No. 10/837,186, filed Apr. 30, 2004, Morrison et al.

U.S. Appl. No. 10/683,944, filed Oct. 1, 2003, Young.

Xilinx, Inc.; "Virtex-II Pro Platform FPGA Handbook"; published Oct. 14, 2002; pp. 49-58 and 180-201, available from Xilinx, Inc., 2100 Logic Drive, San Jose, California 95124.

Landry, J., "Actel ES Family Digital Phase Lock Loop Usage", Sep. 17, 1996, pp. 1-5, available from Actel Corp., 955 East Arques Avenue, Sunnyvale, California 94086.

Microelectronics Group, Lucent Technologies, Inc., Preliminary Data Sheet, DS-163FPGA, May 1998, ORCA OR3Cxx (5 V), and OR3Txxx (3.3 V) Series Field-Programmable Gate Arrays, pp. 3, 69-80, available from Microelectronics Group, Lucent Technologies, Inc., 555 Union Boulevard, Room 30L-15P-BA, Allentown, PA 18103.

Tanaka et al., "High Speed String Edit Methods Using Hierarchical Files and Hashing Technique," Nov. 14-17, 1988 Pattern Recognition: 9th International Conference, vol. 1, copyright 1998 IEEE, pp. 334-336.

Waizman, A.; a Delay Lin Loop for Frequency Synthesis of De-Skewed Clock; Solid-State Circuit Conference, 1994 IEEE; p. 298-299.

* cited by examiner

AUTOMATIC TAP DELAY CALIBRATION FOR PRECISE DIGITAL PHASE SHIFT

CROSS-REFERENCE TO RELATED APPLICATIONS

This application relates to commonly assigned, U.S. Pat. No. 6,400,735, "Glitchless Delay Line Using Gray Code Multiplexer" by Andrew K. Percey, which is incorporated in its entirety herein by reference.

FIELD OF THE INVENTION

The present invention relates to delay lock loops (DLLs) for digital electronics. More specifically, the present invention relates to DLLs capable of locking clock signals over a wide frequency range.

BACKGROUND OF THE INVENTION

Synchronous digital systems, including board level systems and chip level systems, rely on one or more clock signals to synchronize elements across the system. Typically, one or more clock signals are distributed across the system on one or more clock lines. However, due to various problems such as clock buffer delays, high capacitance of heavily loaded clock lines, and propagation delays, the rising edges of a clock signal in different parts of the system may not be synchronized. The time difference between a rising (or falling) edge in one part of the system with the corresponding rising (or falling) edge in another part of the system is referred to as "clock skew".

Clock skew can cause digital systems to malfunction. For example, it is common for circuits in digital systems to have a first flip-flop output driving a second flip-flop input. With a synchronized clock on the clock input of both flip-flops, the data in the first flip-flop is successfully clocked into the second flip-flop. However, if the active edge on the second flip-flop is delayed by clock skew, the second flip-flop might not capture the data from the first flip-flop before the first flip-flop changes state.

Delay lock loops are used in digital systems to minimize clock skew. Delay lock loops typically use delay elements to synchronize the active edges of a reference clock signal in one part of the system with a feedback clock signal from a second part of the system. FIG. 1 shows a block diagram of a conventional delay lock loop 100 coupled to logic circuits 190. Delay lock loop 100, which comprises a delay line 110 and a phase detector 120, receives a reference clock signal REF_CLK and drives an output clock signal O_CLK.

Delay line 110 delays reference clock signal REF_CLK by a variable propagation delay D before providing output clock signal O_CLK. Thus, each clock edge of output clock signal O_CLK lags a corresponding clock edge of reference clock signal REF_CLK by propagation delay D (see FIG. 2A). Phase detector 120 controls delay line 110, as described below. Delay line 110 is capable of producing a minimum propagation delay D_MIN and a maximum propagation delay D_MAX.

Before output clock signal O_CLK reaches logic circuits 190, output clock signal O_CLK is skewed by clock skew 180. Clock skew 180 can be caused by delays in various clock buffers (not shown) or propagation delays on the clock signal line carrying output clock signal O_CLK (e.g., due to heavy loading on the clock signal line). To distinguish output clock signal O_CLK from the skewed version of output clock signal O_CLK, the skewed version is referred to as skewed clock signal S_CLK. Skewed clock signal S_CLK drives the clock input terminals (not shown) of the clocked circuits within logic circuits 190. Skewed clock signal S_CLK is also routed back to delay lock loop 100 on a feedback path 170. Typically, feedback path 170 is dedicated specifically to routing skewed clock signal S_CLK to delay lock loop 110. Therefore, any propagation delay on feedback path 170 is minimal and causes only negligible skewing.

FIG. 2A provides a timing diagram of reference clock signal REF_CLK, output clock signal O_CLK, and skewed clock signal S_CLK. All three clock signals have the same frequency F (not shown) and period P, and all are active-high (i.e., the rising edge is the active edge). Since output clock signal O_CLK is delayed by propagation delay D, a clock edge 220 of output clock signal O_CLK lags corresponding clock edge 210 of reference clock signal REF_CLK by propagation delay D. Similarly, a clock edge 230 of skewed clock signal S_CLK lags corresponding clock edge 220 of output clock signal O_CLK by a propagation delay SKEW, which is the propagation delay caused by clock skew 180 (FIG. 1). Therefore, clock edge 230 of skewed clock signal S_CLK lags clock edge 210 of reference clock signal REF_CLK by a propagation delay DSKEW, which is equal to propagation delay D plus propagation delay SKEW.

Delay lock loop 100 controls propagation delay D by controlling delay line 110. However, delay line 110 cannot create negative delay; therefore, clock edge 230 cannot be synchronized to clock edge 210. Fortunately, clock signals are periodic signals. Therefore, delay lock loop 100 can synchronize reference clock signal REF_CLK and skewed clock signal S_CLK by further delaying output clock signal O_CLK such that clock edge 240 of skewed clock signal S_CLK is synchronized with clock edge 210 of reference clock signal REF_ CLK. As shown in FIG. 2B, propagation delay D is adjusted so that propagation delay DSKEW is equal to period P. Specifically, delay line 110 is tuned so that propagation delay D is increased until propagation delay D equals period P minus propagation delay SKEW. Although propagation delay DSKEW could be increased to any multiple of period P to achieve synchronization, most delay lock loops do not include a delay line capable of creating such a large propagation delay.

Phase detector 120 (FIG. 1) controls delay line 110 to regulate propagation delay D. The actual control mechanism for delay lock loop 100 can differ. For example, in one version of delay lock loop 100, delay line 110 starts with a propagation delay D equal to minimum propagation delay D_MIN, after power-on or reset. Phase detector 110 then increases propagation delay D until reference clock signal REF_CLK is synchronized with skewed clock signal S_CLK. In another system, delay lock loop 100 starts with a propagation delay D equal to the average of minimum propagation delay D_MIN and maximum propagation delay D_MAX, after power-on or reset. Phase detector 120 then determines whether to increase or decrease (or neither) propagation delay D to synchronize reference clock signal REF_CLK with skewed clock signal S_CLK. For example, phase detector 120 would increase propagation delay D for the clock signals depicted in FIG. 2A. However, phase detector 120 would decrease propagation delay D for the clock signals depicted in FIG. 2C.

In FIG. 2C, skewed clock signal S_CLK is said to "lag" reference clock signal REF_CLK, because the time between a rising edge of reference clock signal REF_CLK and the next rising edge of skewed clock signal S_CLK is less than the time between a rising edge of skewed clock signal S_CLK and the next rising edge of reference clock signal REF_CLK. However, in FIG. 2A, reference clock signal REF_CLK is said to "lag" skewed clock signal S_CLK, because the time between a rising edge of skewed clock signal S_CLK and the next rising edge of reference clock signal REF_CLK is less than the time between a rising edge of reference clock signal REF_CLK and the next rising clock edge of skewed clock signal S_CLK. Alternatively, in FIG. 2A skewed clock signal S_CLK could be said to "lead" reference clock signal REF_CLK.

After synchronizing reference clock signal REF_CLK and skewed clock signal S_CLK, delay lock loop 100 monitors reference clock signal REF_CLK and skewed clock signal S_CLK and adjusts propagation delay D to maintain synchronization. For example, if propagation delay SKEW increases, perhaps caused by an increase in temperature, delay lock loop 100 must decrease propagation delay D to compensate. Conversely, if propagation delay SKEW decreases, perhaps caused by a decrease in temperature, delay lock loop 100 must increase propagation delay D to compensate. The time in which delay lock loop 100 is attempting to first synchronize reference clock signal REF_CLK and skewed clock signal S_CLK, is referred to as lock acquisition. The time in which delay lock loop 100 is attempting to maintain synchronization is referred to as lock maintenance. The value of propagation delay D at the end of lock acquisition, i.e. when synchronization is initially established, is referred to as initial propagation delay ID.

However, as explained above, delay line 110 can only provide a propagation delay between a minimum propagation delay D_MIN and a maximum propagation delay D_MAX. During lock maintenance, delay lock loop 100 may lose synchronization if a propagation delay D smaller than minimum propagation delay D_MIN is required to maintain synchronization. Similarly, synchronization may be lost if a propagation delay D greater than maximum propagation delay D_MAX is required to maintain synchronization.

For example, if lock acquisition occurs while the system using delay lock loop 100 is at a very high temperature, delay lock loop 100 is likely to achieve synchronization with a very small initial propagation delay ID, since propagation delay SKEW is likely to be large with respect to period P. As the system's temperature increases further, propagation delay SKEW is likely to increase to a point where propagation delay SKEW plus minimum propagation delay D_MIN is greater than period P. In this situation, delay lock loop 100 must undergo lock acquisition again, which may introduce glitches and noise into output clock signal O_CLK, in turn causing glitches and noise in skewed clock signal S_CLK. For critical systems, such glitches are intolerable. Further, for systems designed for operation at multiple clock frequencies, low frequency operation is likely to compound the problems since clock period P is very long. Long clock periods may cause propagation delay D to vary over a wider time interval. Thus, there is a need for a delay lock loop which can maintain synchronization over a wide range of clock frequencies and environmental extremes.

In addition, conventional delay lock loop circuits provide for precise synchronization of the reference clock signal REF_CLK and the skew clock signal S_CLK. It would be desirable to have a delay lock loop circuit which is capable of providing a skew clock signal S_CLK which is precisely shifted by a relatively small amount with respect to the reference clock signal REF_CLK. It would further be desirable if such delay lock loop circuit were capable of providing both a leading and lagging relationship. Such a delay lock loop circuit would enable the precise control of clock phase in logic circuits. Such control allows, for example, more accurate timing budget allocation, which in turn, allows synchronous digital systems to run at faster speeds.

Moreover, in order to provide an accurate phase shift capability, it is necessary to accurately determine the number of equivalent delay units associated with one clock period, such that the desired phase shift can be specified as percentage of clock period. It would therefore be desirable to have method and structure for accurately and automatically determining the number of delay units associated with a period of a reference clock signal.

SUMMARY OF THE INVENTION

The present invention provides a delay lock loop that synchronizes the reference clock signal with the skewed clock signal using a delay line having an initial propagation delay within a lock window. The lock window is a period of time between the minimum delay of the propagation delay and the maximum propagation delay. The extent of the lock window is chosen to ensure that changes in environmental conditions or clock frequencies, when compensated for by changing the propagation delay of the delay line, do not cause a loss of synchronization. A delay lock loop in accordance with one embodiment of the present invention incorporates a clock phase shifter in addition to the delay line to synchronize the reference clock. The delay line receives the reference clock signal from a reference input terminal of the delay lock loop. The output of the delay line (i.e., the delayed clock signal) is provided to the clock phase shifter, which can generate one or more phase-shifted clock signals. An output generator receives the delayed clock signal and the one or more phase-shifted clock signals. The output generator provides one of the clock signals as the output clock signal on an output terminal. A phase detector compares the reference clock signal with the skewed clock signal, which is received on a feedback input terminal of the delay lock loop, to determine whether to increase or decrease the propagation delay of the delay line to synchronize the reference clock signal and the skewed clock signal.

One embodiment of the clock phase shifter generates N−1 phase-shifted clock signals. Each of the phase-shifted clock signals is phase-shifted from the other N−2 clock signals and the delayed clock signal by 360/N degrees. For example, if the clock phase shifter generated 3 phase-shifted clock signals (i.e., N is equal to four), the phase-shifted clock signals would be phase-shifted from the delayed clock signal by 90 degrees, 180 degrees, and 270 degrees. The clock phase shifter can be implemented using N delay lines and a phase detector.

The delay lock loop can include a controller to control the delay line and the output generator. In one embodiment of the invention, the controller causes the output generator to drive the delayed clock signal as the output clock. The controller synchronizes the reference clock signal with the skewed clock signal by adjusting the propagation delay of the delay line to an initial delay. If the initial delay is not within the lock window, the controller causes the output generator to drive a first phase-shifted clock signal as the output signal. The controller and phase detector then synchronize the reference clock signal with the skewed clock signal by adjusting the propagation delay of the delay line to a second initial delay. If the second initial delay is not within the lock window, the controller causes the output generator to use a second phase-shifted clock signal as the output clock. The controller continues in this manner until an initial delay within the lock window is found.

In another embodiment of the invention, the clock phase shifter is coupled to receive the reference clock signal. The clock phase shifter generates phase-shifted clock signals that are phase-shifted from the reference clock signals. The reference clock signal or one of the phase-shifted clock signals from the clock shifter is selected to be the input signal of the delay line. The delay line is controlled by the controller and the phase detector to delay the input clock signal and synchronize the skewed clock signal with the reference clock signal.

After the delay lock loop synchronizes the reference clock signal with the skewed clock signal, a digital phase shifter can be used to shift the skewed clock signal by a small amount with respect to the reference clock signal. In accordance with one embodiment, the tap/trim settings of a delay line in the clock phase shifter are transmitted to the digital phase shifter, thereby informing the digital phase shifter of the period of the reference clock signal. In response, the digital phase shifter provides a phase control signal that introduces a delay, which is referenced to the period of the reference clock signal, to either the reference clock signal or the skew clock signal. The phase control signal is proportional to a fraction of the period of the reference clock signal. In one embodiment, the period of the reference clock signal is determined from the tap/trim settings of a delay line in the clock phase shifter. The delay line can have, for example, 512 tap/trim units. The phase control signal is determined by multiplying the equivalent tap/trim units used by a delay line in the clock phase shifter by a fraction. The fraction can be determined by the contents of configuration memory bits stored in an FPGA, or by a user-defined signal.

The digital phase shifter can be controlled to operate in one of two fixed modes or in one of two variable modes. In the first fixed mode, the digital phase shifter introduces delay to the skew clock signal. For example, the digital phase shifter can introduce a delay in the range of 0 to 511 tap/trim units to the skew clock signal in the first fixed mode. In the second fixed mode, the digital phase shifter introduces delay to the reference clock signal. For example, the digital phase shifter can introduce a delay in the range of 0 to 511 tap/trim units to the reference clock signal in the second fixed mode. In the first variable mode, the digital phase shifter can introduce a delay equal to 255 to −255 tap/trim units to the reference clock signal. In the second variable mode, the digital phase shifter can introduce a delay equal to 255 to −255 tap/trim units to the skew clock signal.

In accordance with another embodiment, the digital phase shifter is capable of operating in a low frequency mode or a high frequency mode. The digital phase shifter is controlled to adjust the tap/trim setting provided by the delay line of the clock phase shifter to compensate for different overhead delays experienced by the clock phase shifter in the low frequency mode and the high frequency mode.

In accordance with another embodiment, the digital phase shifter is capable of automatically determining the equivalent taps per clock period, each time the delay lock loop is used. More specifically, the digital phase shifter is controlled to route a reference clock signal through a first path having a first delay, thereby creating a first delayed signal. The digital phase shifter is further controlled to route the reference clock signal through a second path having a second delay, thereby creating a second delayed clock signal. The first delay is slightly greater than the second delay, such that the second delayed clock signal initially leads the first delayed clock signal.

The digital phase shifter is controlled to incrementally introduce delay elements to the second path until the first delayed clock signal leads the second delayed clock signal at a first time. At this time, the digital phase shifter identifies the number of delay elements introduced at the first time.

The digital phase shifter is then controlled to incrementally introduce additional delay elements to the second path until the second delayed clock signal leads the first delayed clock signal at a second time. The digital phase shifter identifies the number of delay elements introduced at the second time. The digital phase shifter then determines the total number of delay elements introduced between the first time and the second time. This total number of introduced delay elements corresponds with one period of the reference clock signal. Advantageously, a subsequent phase shift can be identified as a fraction of the total number of introduced delay elements.

If insufficient delay elements exist to cause the second delayed clock signal to lead the first delayed clock signal at a second time, then the digital phase shifter can use different input signals. For example, a first clock signal having a first phase relationship with respect to the reference clock can be routed through a first path having a first delay, thereby creating a first delayed clock signal. A second clock signal having a second phase relationship with respect to the reference clock can be routed through a second path having the first delay, thereby creating a second delayed clock. Digital phase shifter can then incrementally introduce delay elements to the second path until the first delayed clock is synchronous with the second delayed clock. The number of delay elements introduced to the second path to synchronize the first delayed clock and the second delayed clock can then be used to determine the equivalent number of delay elements per period of the reference clock signal.

For example, if the first clock signal initially lags the second clock signal by one quarter clock period, then the number of delay elements introduced to the second path is multiplied by four to determine the equivalent number of delay elements per period of the reference clock signal. Similarly, if the first clock signal initially lags the second clock signal by one half clock period, then the number of delay elements introduced to the second path is multiplied by two to determine the equivalent number of delay elements per period of the reference clock signal.

Alternately, the digital phase shifter is used to directly measure the signal delay through a clock phase shifter of the delay lock loop, thereby directly determining the high frequency and low frequency overhead constants.

In accordance with this embodiment, the digital phase shifter routes the reference clock signal through a first path having a first delay, thereby creating a first delayed clock signal. The reference clock signal is also routed through a clock phase shifter set at a minimum delay, and through a second path of the digital phase shifter having the first delay, thereby creating a second delayed clock signal.

The digital phase shifter then incrementally introduces delay elements to the first path until the first delayed clock signal is synchronous with the second delayed clock signal. The digital phase shifter then determines the number of delay elements introduced to the first path to synchronize the first delayed clock signal and the second delayed clock signal. The determined number of delay elements is then used to derive the delay overhead associated with the clock phase shifter. This overhead delay can then be used to accurately estimate the delay elements associated with one period of the reference clock signal.

The present invention will be more fully understood in view of the following description and drawings.

DETAILED DESCRIPTION OF THE DRAWINGS

Figure 1:
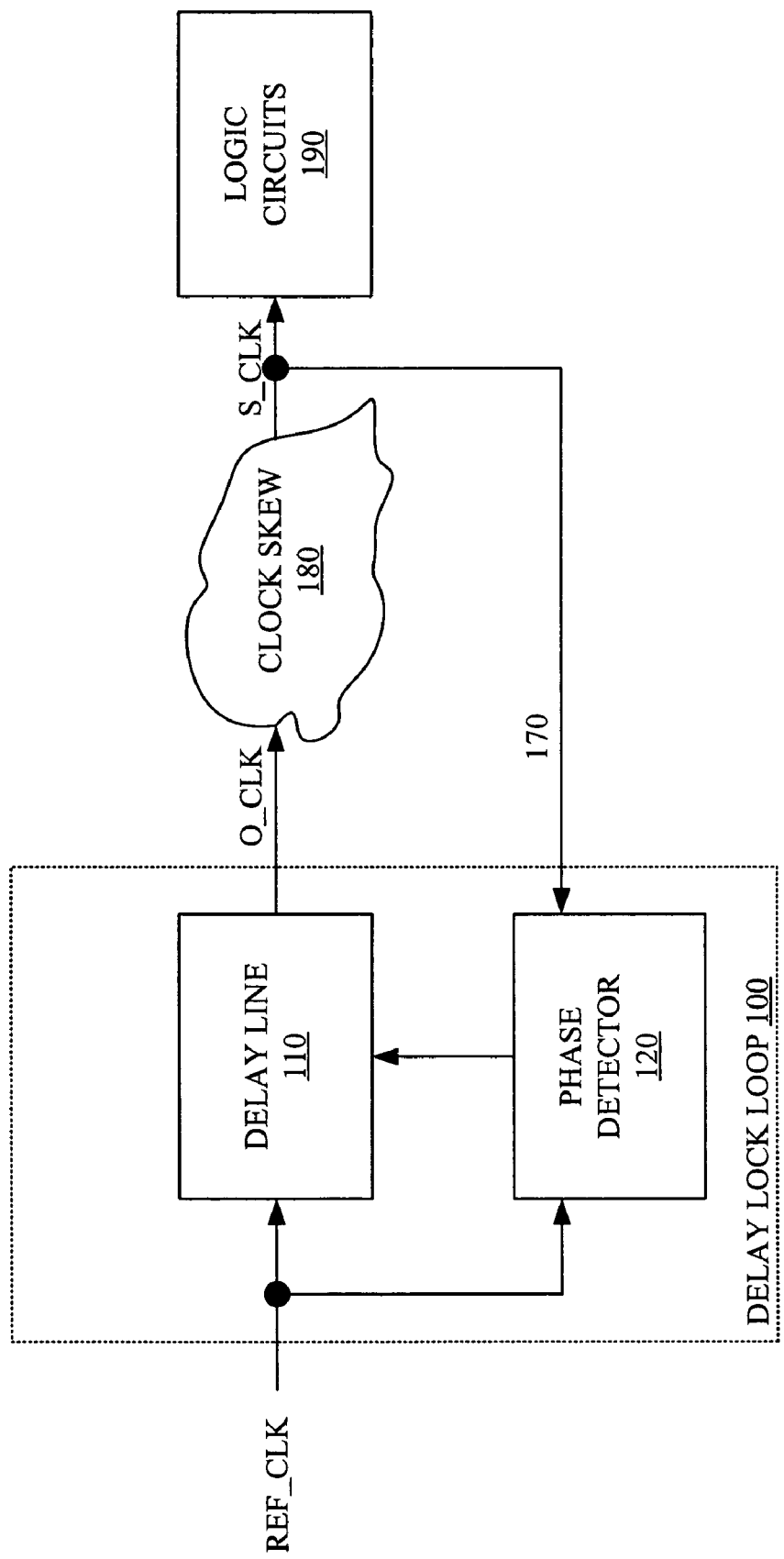
FIG. 1 is a block diagram of a system using a conventional delay lock loop.
Figure 2A:
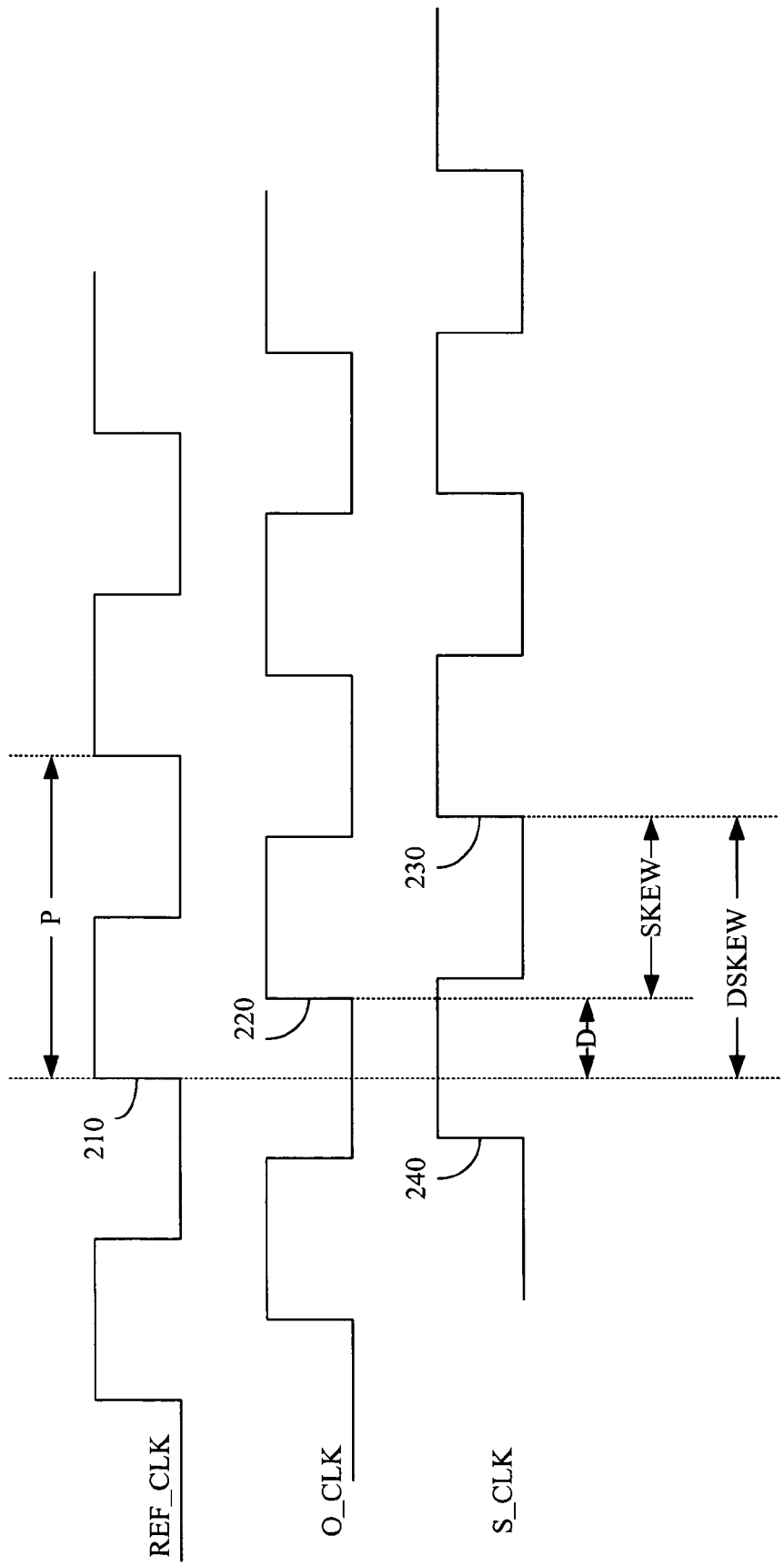
FIGS. 2A, 2B and 2C are timing diagrams for the system of FIG. 1.
Figure 2B:
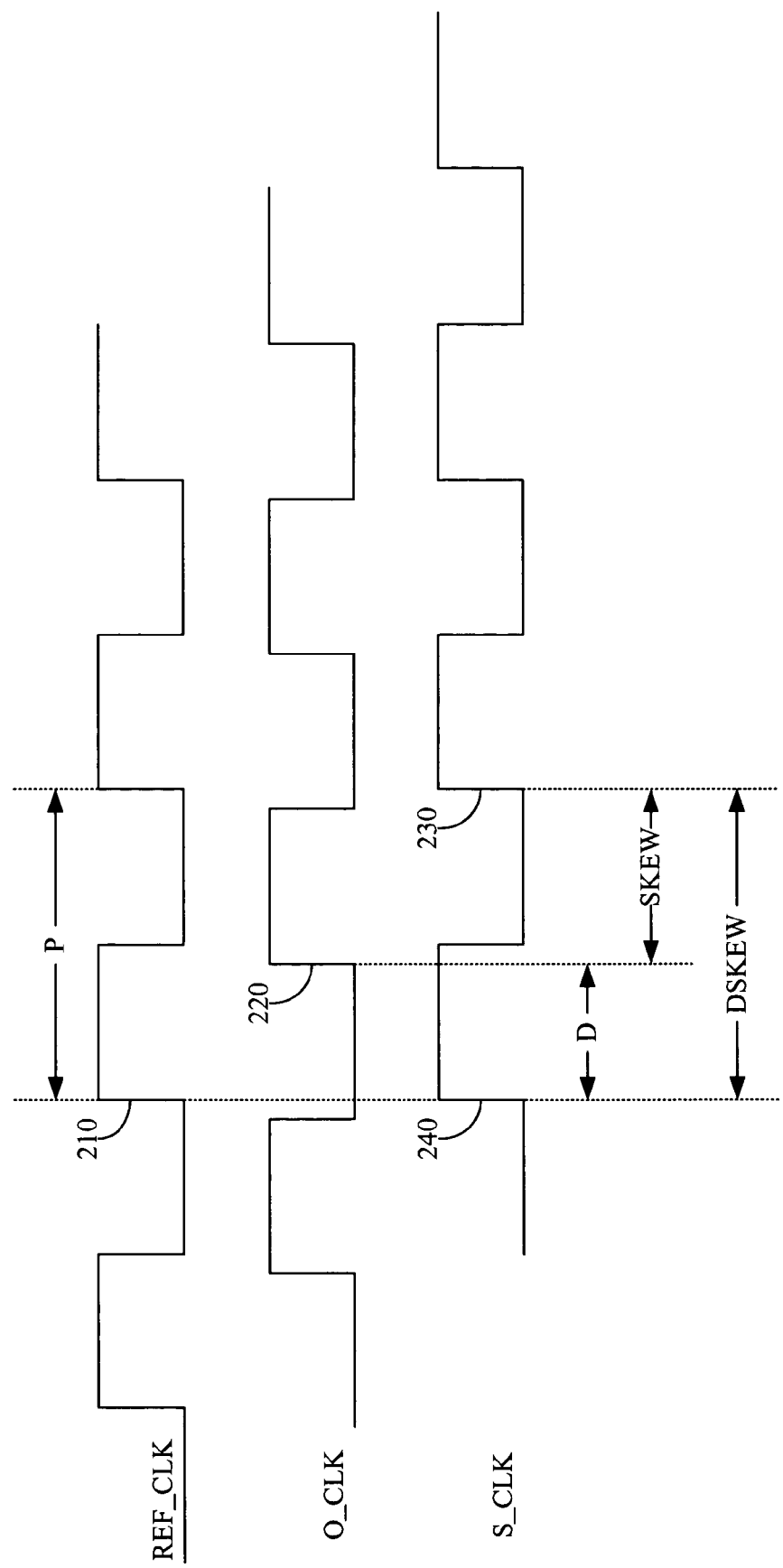
Figure 2C:
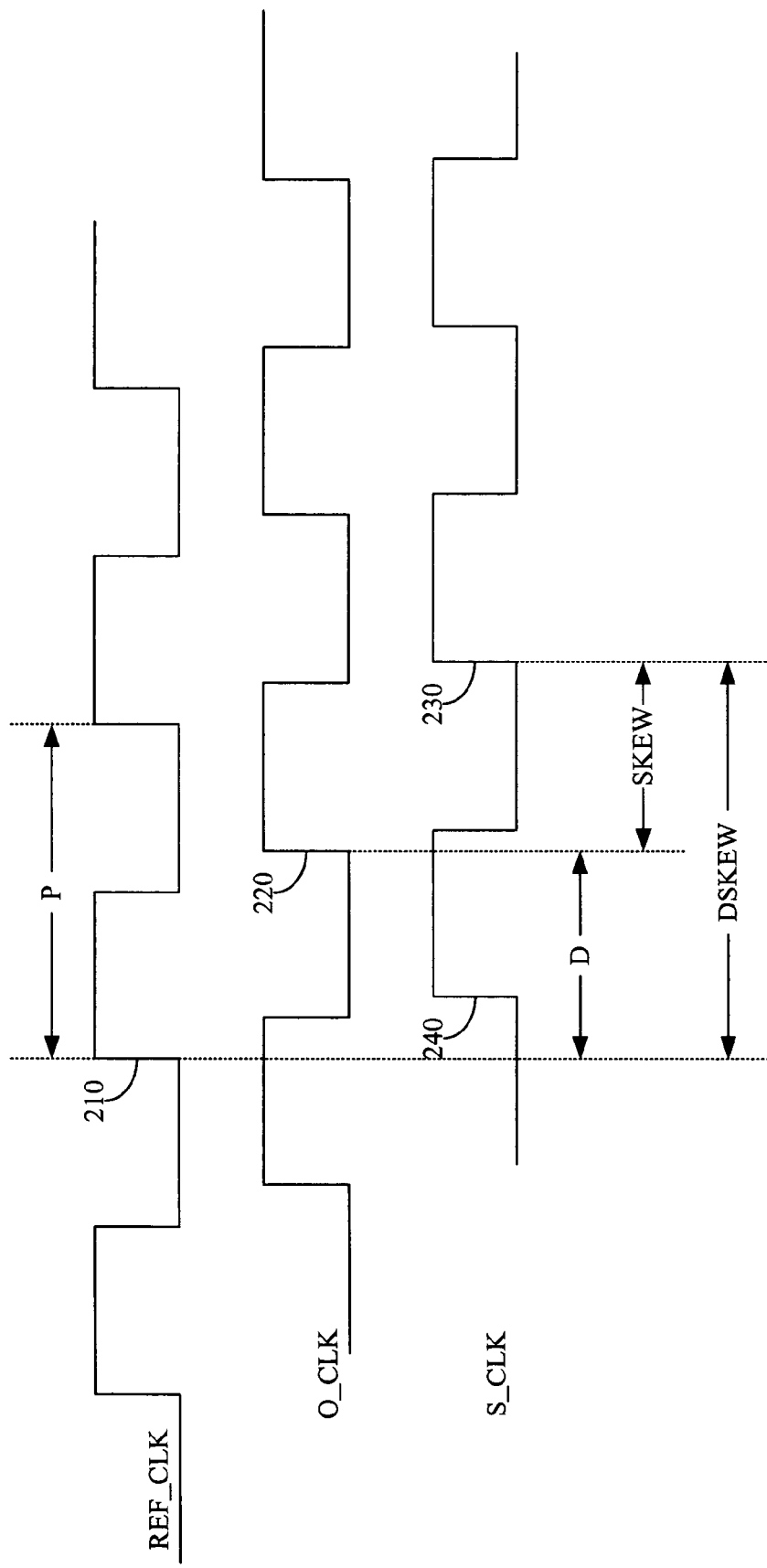
Figure 3:
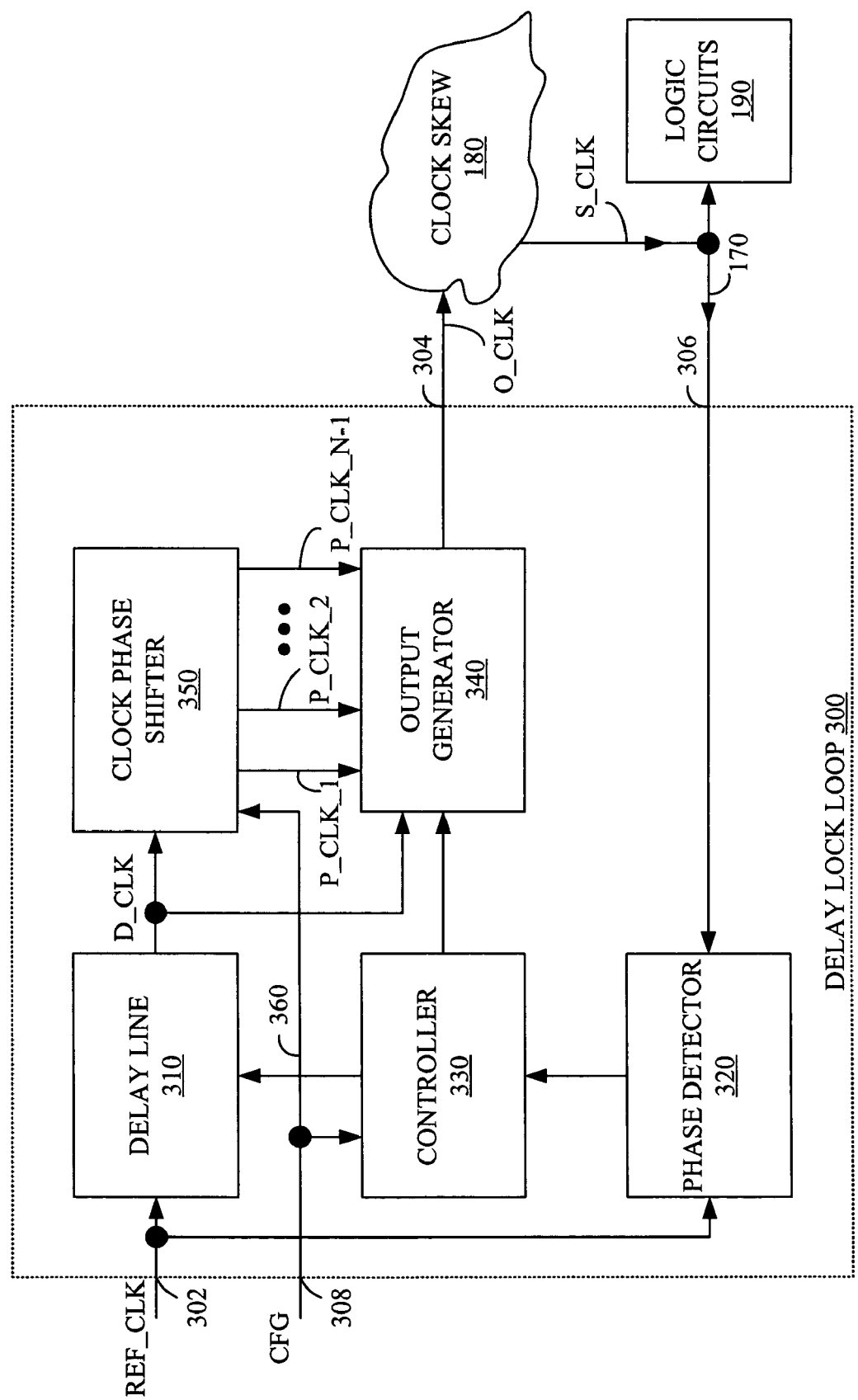
FIG. 3 is a block diagram of a system using an embodiment of a delay lock loop in accordance with the present invention.

FIG. 3 is a block diagram of a system using a delay lock loop 300 in accordance with one embodiment of the present invention. Delay lock loop 300 comprises a delay line 310, a clock phase shifter 350, a controller 330, an output generator 340, and a phase detector 320. Delay lock loop 300 receives reference clock signal REF_CLK on a reference input terminal 302 and generates output clock signal O_CLK on output terminal 304. As explained above with respect to FIG. 1, output clock signal O_CLK is skewed by clock skew 180 into skewed clock signal S_CLK, which clocks logic circuits 190.

Skewed clock signal S_CLK is also fed back to a feedback terminal 306 of delay lock loop 300 on feedback path 170.

Within delay lock loop 300, reference clock signal REF_CLK is delayed by delay line 310 to generate delayed clock signal D_CLK. Delayed clock signal D_CLK is delayed from clock signal REF_CLK by a propagation delay D in delay line 310. One embodiment of delay lock loop 300 uses an adjustable delay line described in U.S. Pat. No. 6,400,735, entitled "Glitchless Delay Line Using Gray Code Multiplexer", which is referenced above. However, other adjustable delay lines can also be used with delay lock loop 300. Delayed clock signal D_CLK is provided to an input terminal of a clock phase shifter 350 and to an input terminal of an output generator 340.

Clock phase shifter 350 generates one or more phase-shifted clock signals P_CLK_1 to P_CLK_N−1, where N is a positive integer. In one embodiment, phase-shifted clock signal P_CLK_1 is phase-shifted by 360/N degrees from delayed clock signal D_CLK. Phase-shifted clock signal P_CLK_2 is phase-shifted by 2*(360/N) degrees. Phase-shifted clock signal P_CLK_N−1 is phase-shifted by (N−1)*(360/N) degrees. Thus, in general a phase-shifted clock signal P_CLK_Z is phase-shifted by Z*(360/N), where Z is an integer between 1 and (N−1), inclusive. Delayed clock signal D_CLK can be considered a phase-shifted clock signal P_CLK_0 since delayed clock signal D_CLK has a 0 degree phase shift from itself. Further, in some embodiments of delay lock loop 300, clock phase shifter 350 generates a phase-shifted signal P_CLK_N that has the same phase and frequency as delayed clock signal D_CLK.

Thus, in an embodiment of clock phase shifter 350 where N is equal to four, phase-shifted clock signal P_CLK_1 is phase-shifted 90 degrees from delayed clock signal D_CLK. It logically follows that phase-shifted clock signal P_CLK_2 is phase-shifted by 180 degrees from delayed clock signal D_CLK and phase-shifted clock signal P_CLK_3 is phase-shifted by 270 degrees from delayed clock signal D_CLK. However, the principles of the present invention are also suitable for other embodiments of clock phase shifter 350 using other patterns of phase shifting between the phase-shifted clock signals.

Phase shifting is a concept in the frequency domain of a clock signal. The equivalent of phase shifting in the time domain is delaying the clock signal. Specifically, if a first clock signal is phase-shifted from a second clock signal by x degrees, the first clock signal is delayed by X*(P/360), where P is the period of the first and second clock signals. Thus, if phase-shifted clock signal P_CLK_1 is phase-shifted 90 degrees from delayed clock signal D_CLK, phase-shifted clock signal P_CLK_1 is delayed by one-fourth of the period of delayed clock signal D_CLK. To distinguish delays caused by phase shifting from other propagation delays, delays caused by phase shifting are referred to as phase-shifted delays P_D_Z. Since a phase-shifted clock signal P_CLK_Z is phase-shifted by Z*(360/N) degrees, phase-shifted clock signal P_CLK_Z has a phase-shifted delay P_D_Z equal to Z*(P/N), where Z is an integer between 1 and (N−1), inclusive.

Figure 4:
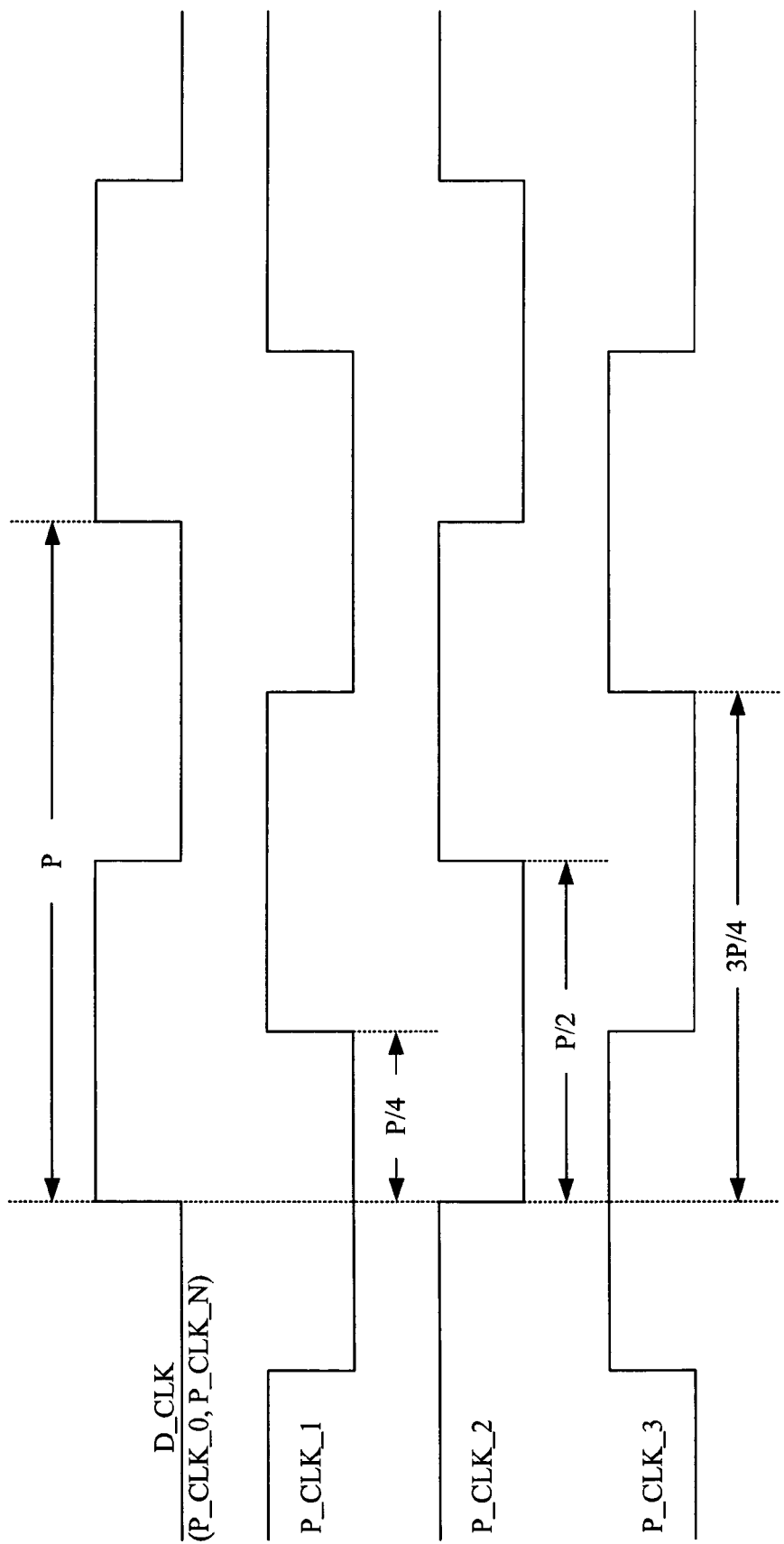
FIG. 4 is a timing diagram for the delay lock loop of FIG. 3.

FIG. 4 illustrates a timing diagram for delay lock loop 300 (FIG. 3) wherein N equals 4. Specifically, clock phase shifter 350 generates phase-shifted clock signal P_CLK_1 90 degrees out of phase with delayed clock signal D_CLK. Thus, phase-shifted clock signal P-CLK_1 is delayed by one-fourth of clock period P. Clock phase shifter 350 generates phase-shifted clock signal P_CLK_₂ 180 degrees out of phase with delayed clock signal D_CLK. Thus, phase-shifted clock signal P_CLK_2 is delayed by half of clock period P. Finally, clock phase shifter 350 generates phase-shifted clock signal P_CLK_3 270 degrees out of phase with delayed clock signal D_CLK. Thus, phase-shifted clock signal P_CLK_3 is delayed by three-fourths of clock period P.

Returning to FIG. 3, clock phase shifter 350 provides the phase-shifted clock signals to various input terminals of output generator 340. In some embodiments of delay lock loop 300, clock phase shifter 350 can be configured using one or more configuration signals CFG on an optional configuration bus 360. An embodiment of clock phase shifter 350 that is configured by configuration signals CFG is described below with respect to FIG. 7. Configuration signals CFG are received on configuration terminals 308 and are routed to clock phase shifter 350 and controller 330 by configuration bus 360. Output generator 340 selects either delayed clock signal D_CLK or one of the phase-shifted clock signals to provide as output clock signal O_CLK. For embodiments of delay lock loop 300 in which clock phase shifter 350 provides phase-shifted clock signal P_CLK_N, output generator 340 can use phase-shifted clock signal P_CLK_N in place of delayed clock signal D_CLK. Controller 330 controls output generator 340.

Controller 330 receives phase information regarding reference clock signal REF_CLK and skewed clock signal S_CLK from phase detector 320. Specifically, phase detector 320 informs controller 330 whether propagation delay D from delay line 310 should be increased or decreased to achieve synchronization of skewed clock signal S_CLK with reference clock signal REF_CLK. For embodiments of phase detector 320 that only determine whether to increase or decrease propagation delay D, a jitter filter (not shown) can be used to reduce clock jitter. In one embodiment, the jitter filter is an up/down counter (not shown) that decrements by one if propagation delay D should be decreased and increments by one if propagation delay D should be increased. However, propagation delay D is not adjusted until the up/down counter reaches 0 or some other predetermined number. When propagation delay D is adjusted, the up/down counter is reset to one-half the maximum value. In other embodiments, phase detector 320 calculates the amount propagation delay D should be increased or decreased. During lock acquisition, controller 330 attempts to synchronize skewed clock signal S_CLK with reference clock signal REF_CLK so that initial propagation delay ID of propagation delay D is within a lock window W.

Figure 5:
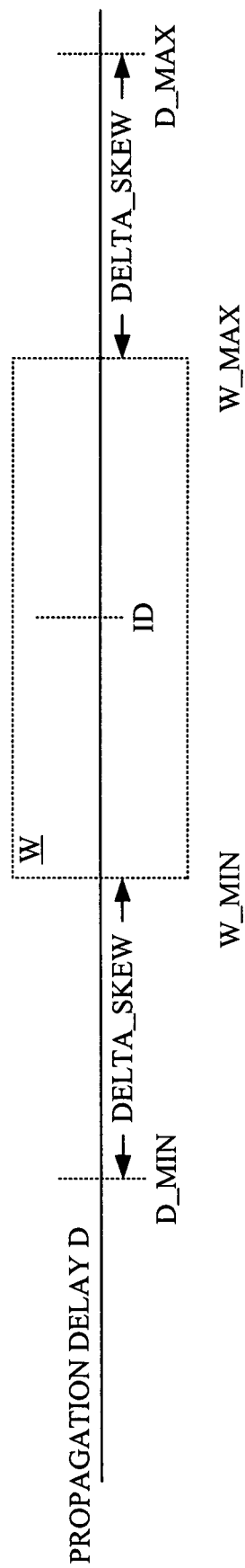
FIG. 5 illustrates a lock window as used in accordance with one embodiment of the present invention.

FIG. 5 illustrates the concepts of lock window W. As explained above, propagation delay D must be between minimum propagation delay D_MIN and maximum propagation delay D_MAX. Typical values for D_MIN and D_MAX are 3.2 nanoseconds and 46.8 nanoseconds, respectively. During lock acquisition, controller 330 ensures that initial propagation delay ID of propagation delay D is within lock window W. Specifically, when synchronization is first established initial propagation delay ID must be between lock window minimum W_MIN and lock window maximum W_MAX. The limits on lock window W are set to guarantee that once delay lock loop 300 completes locks acquisition, delay lock loop 300 can maintain synchronization as long as the system containing delay lock loop 300 operates within the design guidelines of the system.

For example, the system containing delay lock loop 300 generally can operate in a range of operating conditions. The range of operating conditions includes a maximum extreme condition in which propagation delay SKEW is maximized at a propagation delay value SKEW_MAX. Similarly, the range of operating conditions also includes a minimum extreme condition in which propagation delay SKEW is minimized at a propagation delay value SKEW_MIN. Thus, the maximum change (DELTA_SKEW) in propagation delay SKEW during operation of the system is equal to propagation delay value SKEW_MAX minus propagation delay value SKEW_MIN (i.e., DELTA_SKEW=SKEW_MAX−SKEW_MIN). For maximum protection during lock maintenance, lock window minimum W_MIN can be equal to minimum propagation delay D_MIN plus DELTA_SKEW. Similarly, lock window maximum W_MAX can be equal to maximum propagation delay D_MAX minus DELTA_SKEW. In one embodiment of the present invention, lock window minimum W_MIN is equal to approximately 16.5% of maximum propagation delay D_MAX and lock window maximum W_MAX is equal to approximately 67.8% of maximum propagation delay D_MAX.

As explained above with respect to FIG. 1, for a conventional delay lock loop synchronization of skewed clock signal S_CLK with reference clock signal REF_CLK is achieved when propagation delay D plus propagation delay SKEW is equal to a multiple of period P. In equation form:

$$D+SKEW=MULT(P) \qquad (1)$$

where MULT(P) refers to a multiple of P. Usually, the smallest multiple of P greater than SKEW is used.

With delay lock loop 300, controller 330 can also use the delays from the phase-shifted clock signals. Thus delay lock loop 300 can achieve synchronization if propagation delay D plus a phase-shifted delay P_D from a phase-shifted clock signal plus propagation delay SKEW is a multiple of period P. In equation form:

$$D+P\_D\_Z+SKEW=MULT(P) \qquad (2)$$

where P_D_Z refers to a phase-shifted delay from phase-shifted clock signal P_CLK_Z. Usually, the smallest multiple of P greater than propagation delay SKEW plus phase-shifted delay P_D_Z is used. As explained above with respect to FIG. 3, in one embodiment of clock phase shifter 350 phase-shifted delay P_D_Z of a phase-shifted clock signal P_CLK_Z is equal to Z*(P/N), where Z is an integer between 0 and (N−1), inclusive. If Z is equal to 0, controller 330 causes output generator 340 to use delayed clock signal D_CLK as output clock signal O_CLK. Thus, phase-shifted delay P_D_0 is equal to 0.

For clarity, initial delay ID can be referred to initial delay ID_0 if output generator 340 uses delayed clock signal D_CLK for output clock signal O_CLK. Similarly, initial delay ID can be referred to as initial delay ID_Z, if output generator 340 uses phase-shifted clock signal P_CLK_Z for output clock signal O_CLK, where Z is a positive integer between 1 and (N−1), inclusive. Thus, at the end of lock acquisition, equation (2) can be rewritten as:

$$ID\_Z+P\_D\_Z+SKEW=MULT(P) \qquad (3)$$

Re-arranging equation (3) provides:

$$ID\_Z=MULT(P)-SKEW-P\_D\_Z \qquad (4)$$

and substituting Z*(P/N) for P_D_Z provides:

$$ID\_Z=MULT(P)-SKEW-Z*(P/N) \qquad (5)$$

Usually, the smallest multiple of P that results in a positive initial delay ID_Z is used. In situations where initial delay ID_Z is less than minimum propagation delay D_MIN or greater than maximum propagation delay D_MAX, delay lock loop 300 cannot synchronize skewed clock signal S_CLK with reference clock signal REF_CLK using phase-shifted clock signal P_CLK_Z.

Because controller 330 can select any one of phase-shifted clock signals P_CLK_Z to drive output clock signal O_CLK, controller 330 can select from N initial delay values. The possible initial delay values range from a minimum offset value (MULT(P)−SKEW) to a maximum value (MULT(P)−SKEW+(N−1)/(N*period P)). The difference between each initial delay value is period P divided by N. For example, if N equals four, period P equals 40 nanoseconds, and propagation delay SKEW equals 25 nanoseconds; then initial delays ID_0, ID_1, ID_2, and ID_3 equal 15 nanoseconds, 5 nanoseconds, 35 nanoseconds, and 25 nanoseconds, respectively (as calculated using equation (5)). If N equals four, period P equals 40 nanoseconds, and propagation delay SKEW equals 55 nanoseconds; then initial delays ID_0, ID_1, ID_2, and ID_3 equal 25 nanoseconds, 15 nanoseconds, 5 nanoseconds, and 35 nanoseconds, respectively. Thus, controller 330 is likely to find one or more initial delay values within lock window W. If more than one initial delay value is within lock window W, controller 330 can select any one of the initial delay values within lock window W.

Some embodiments of controller 330 can perform the calculations described above to determine which phase-shifted clock signal P_CLK_Z to use. However, other embodiments use trial and error to determine which phase-shifted clock signal P_CLK_Z to use. An embodiment of controller 330 that uses trial and error is described below with respect to FIG. 9.

Figure 6:
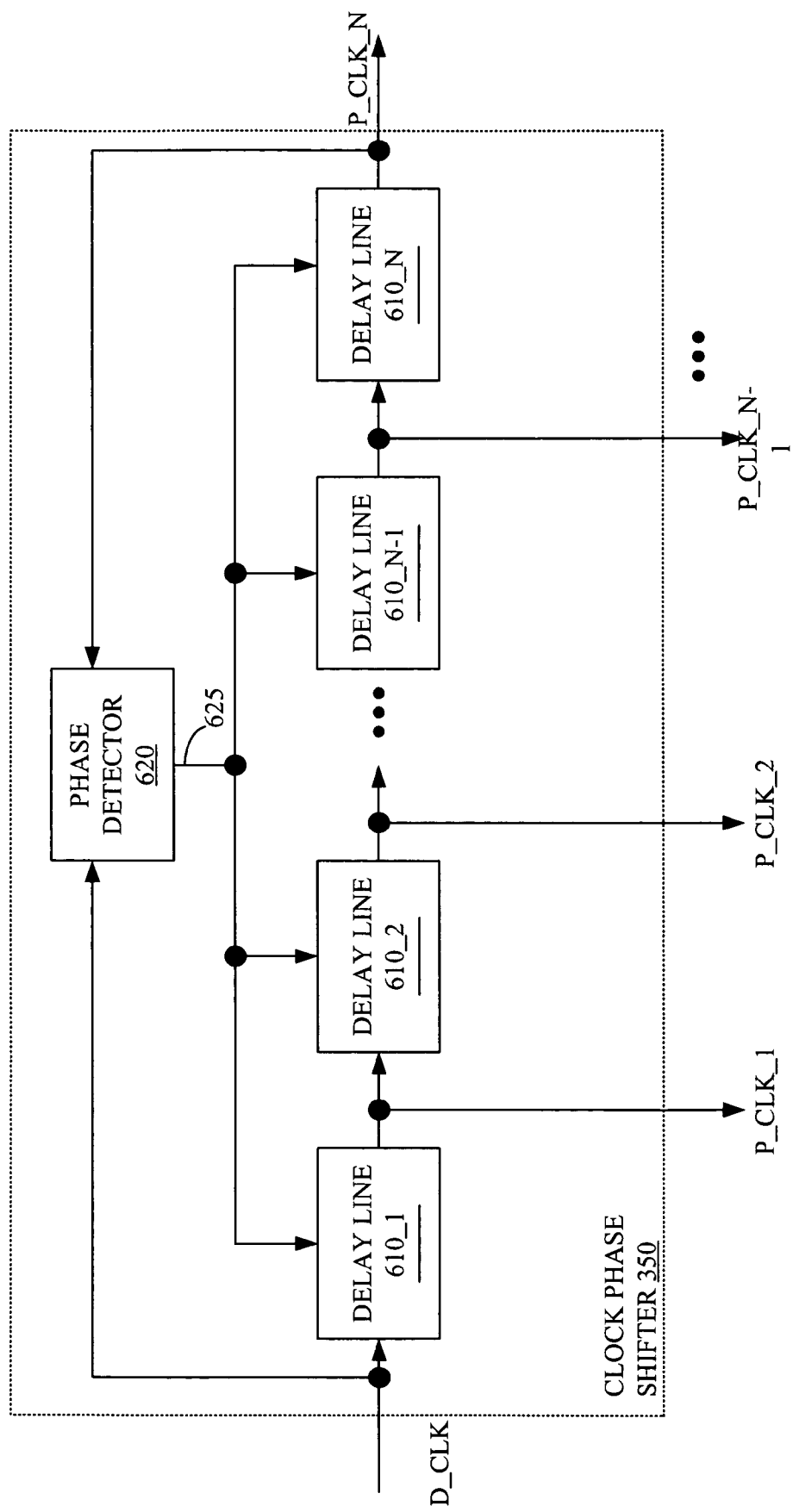
FIG. 6 is a block diagram of an embodiment of a clock phase shifter in accordance with the present invention.

FIG. 6 illustrates one embodiment of clock phase shifter 350 of FIG. 3. The embodiment of clock phase shifter 350 in FIG. 6 comprises a phase detector 620 and a plurality of delay lines 610_1 to 610_N. Delay lines 610_1 to 610_N are coupled in series. The input terminal of delay line 610_1 receives an input clock signal such as delayed clock signal D_CLK (FIG. 3). The output terminal of delay line 610_N is coupled to an input terminal of phase detector 620. Phase detector 620 also receives input clock signal D_CLK on another input terminal. Phase detector 620 controls all the delay lines in parallel via control line 625, and each delay line provides the same amount of propagation delay. Consequently, input clock signal D_CLK and the clock signal P_CLK_N on the output terminal of delay line 610_N are synchronized, i.e., in phase. Further, phase detector 620 causes the total propagation delay generated by delay lines 610_1 to 610_N to be equal to one period P of the input clock. Thus, each delay line provides a propagation delay of P/N. Thus, the output terminal of delay line 610_1 provides a clock signal that is delayed from the input clock signal by P/N whereas the output terminal of delay line 610_2 provides a clock signal that is delayed from the input clock signal by 2*P/N. In general, the output terminal of delay line 610_z provides a clock signal that is delayed from the input clock signal by Z*P/N, where Z is an integer between 1 and N−1, inclusive. Accordingly, if the input clock signal is delayed clock signal D_CLK, the output terminals of delay lines 610_1 to 610_N−1 provide phase-shifted clock signals P_CLK_1 to P_CLK_N−1, respectively. Some embodiments of clock phase shifter 350 also generate a clock signal P_CLK_N on the output terminal of delay line 610_N that has the same phase as delayed clock signal D_CLK.

Figure 7:
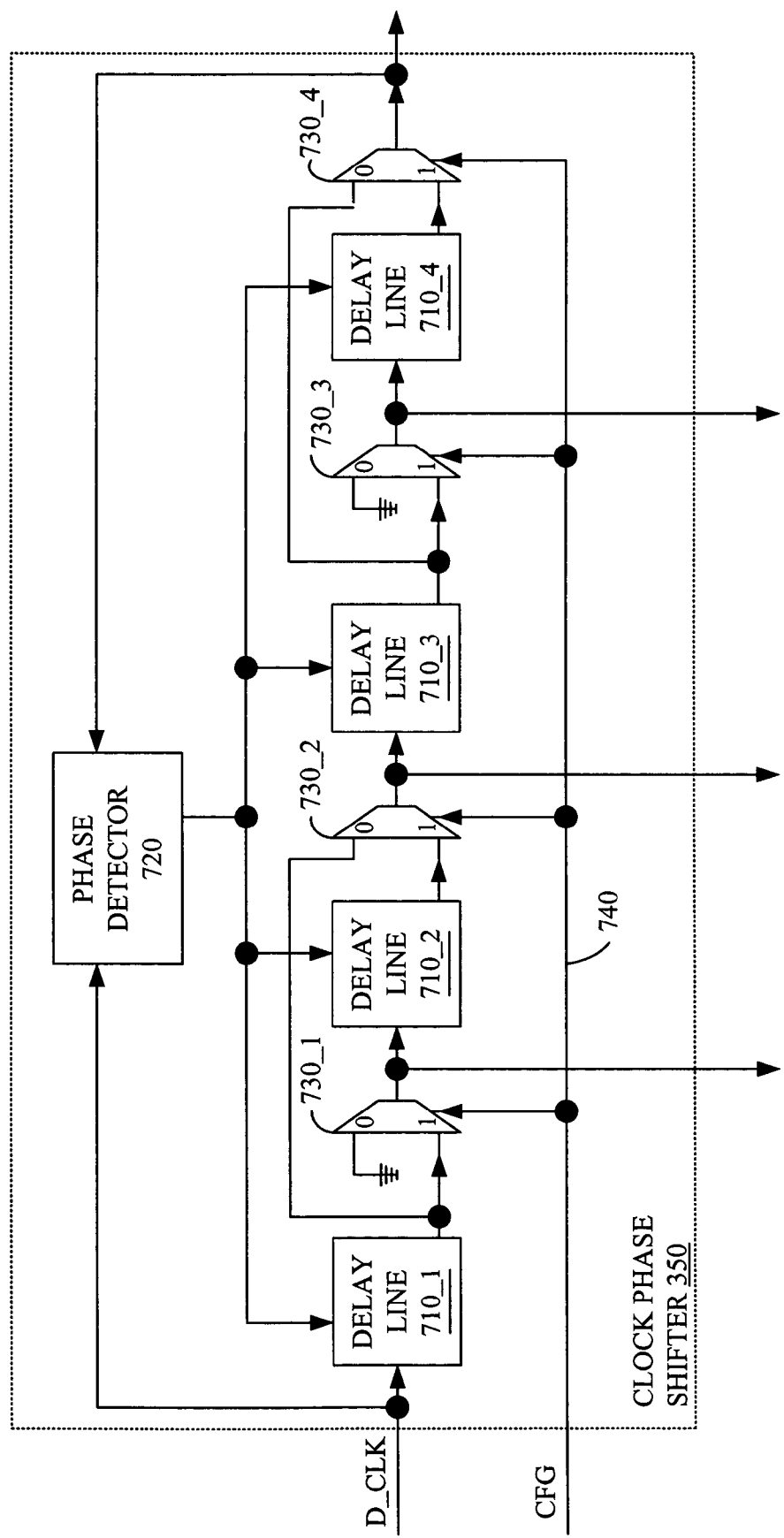
FIG. 7 is a block diagram of another embodiment of a clock phase shifter in accordance with the present invention.

FIG. 7 shows a configurable embodiment of clock phase shifter 350 of FIG. 3. Specifically, the clock phase shifter of FIG. 7 can be configured in a first mode to produce three phase-shifted clock signals that are 90 degrees, 180 degrees, and 270 degrees out of phase with an input clock signal. In a second mode, the clock phase shifter of FIG. 7 produces a single phase-shifted clock signal that is 180 degrees out of phase with the input clock signal. The clock phase shifter of FIG. 7 comprises a phase detector 720, delay lines 710_1, 710_2, 710_3, and 710_4, and multiplexers 730_1, 730_2, 730_3, and 730_4. A configuration line 740 is coupled to the select terminal of multiplexers 730_1 to 730_4.

The input terminal of delay line 710_1 is coupled to receive an input clock signal such as delayed clock signal D_CLK (FIG. 3). The output terminal of each delay line 710_Z is coupled to the logic one input terminal of multiplexer 730_Z, where Z is an integer between 1 and 3, inclusive. The output terminal of each multiplexer 730_Z is coupled to the input terminal of delay line 710_z+1, where Z is an integer between 1 and 3, inclusive. The output terminal of multiplexer 730_4 is coupled to an input terminal of phase detector 720. The logic zero input terminals of multiplexer 730_1 and multiplexer 730_3 are coupled to ground. However, the logic zero input terminal of multiplexer 730_2 is coupled to the output terminal of delay line 710_1. Similarly, the logic zero input terminal of multiplexer 730_4 is coupled to the output terminal of delay line 710_3. Phase detector 720 also receives input clock signal D_CLK on another input terminal. Phase detector 720 controls delay lines 710_1 to 710_4 in parallel as described above with respect to phase detector 620.

If configuration line 740 is pulled to logic one, which puts the embodiment of FIG. 7 into the first mode, delay lines 710_1 to 710_4 are coupled in series. In the first mode, each delay line provides a delay of P/4. Thus, if the input clock signal is delayed clock signal D_CLK, the output terminal of each multiplexer 730_Z can provide phase-shifted clock signals P_CLK_1, P_CLK_2, and P_CLK_3.

However, if configuration line 740 is pulled to logic zero, which puts the embodiment of FIG. 7 into the second mode, only delay lines 710_1 and 710_3 are coupled in series. Delay lines 710_2 and 710_4 have their input terminal coupled to ground through multiplexers 730_1 and 730_3, respectively. In the second mode delay lines 710_1 and 710_3 each provide a delay of P/2. Coupling the input terminals of delay lines 710_2 and 710_4 to ground reduces power consumption and switching noise. However, in the second mode the embodiment of FIG. 7 produces only one output clock signal, which is 180 degrees out of phase with the input clock signal and is generated at the output terminal of multiplexer 730_2.

An alternative embodiment of phase shifter 350 is described in U.S. patent application Ser. No. 10/792,055, entitled "Digital High Speed Programmable Delayed Locked Loop" by Wei Guang Lu, which is incorporated herein in its entirety.

Figure 8:
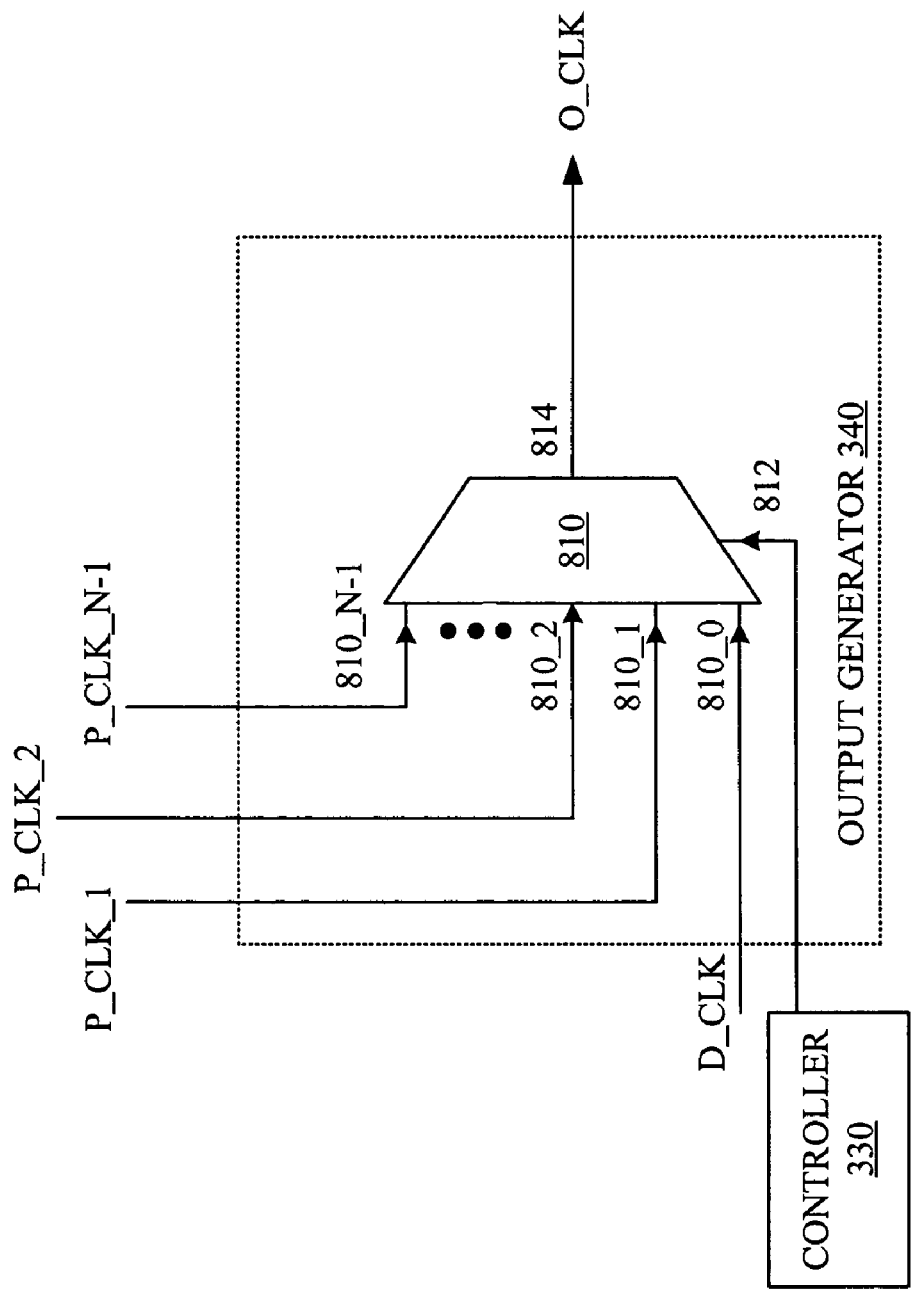
FIG. 8 is a block diagram of an output generator in accordance with the present invention.

FIG. 8 shows one embodiment of output generator 340 of FIG. 3. The output generator of FIG. 8 comprises an N-input multiplexer 810. N-input multiplexer 810 has N input terminals, referenced as 810_0 to 810_N−1, select terminals 812, and an output terminal 814. When the embodiment of output generator 340 of FIG. 8 is used in delay lock loop 300 of FIG. 3, select terminals 812 are coupled to controller 330, input terminal 810_0 is coupled to receive delayed clock signal D_CLK, output terminal 814 provides output clock signal O_CLK, and input terminals 810_1 to 810_N−1 are coupled to receive phase-shifted clock signals P_CLK_1 to P_CLK_N−1, respectively. Select signals on select terminals 812 determine which input signal is provided on output terminal 814. Other embodiments of output generator 340 may include additional circuitry, such as clock buffers and clock dividers. In addition, some embodiments of output generator 340 drive additional clock signals, such as various versions of the phase-shifted clock signals.

Figure 9:
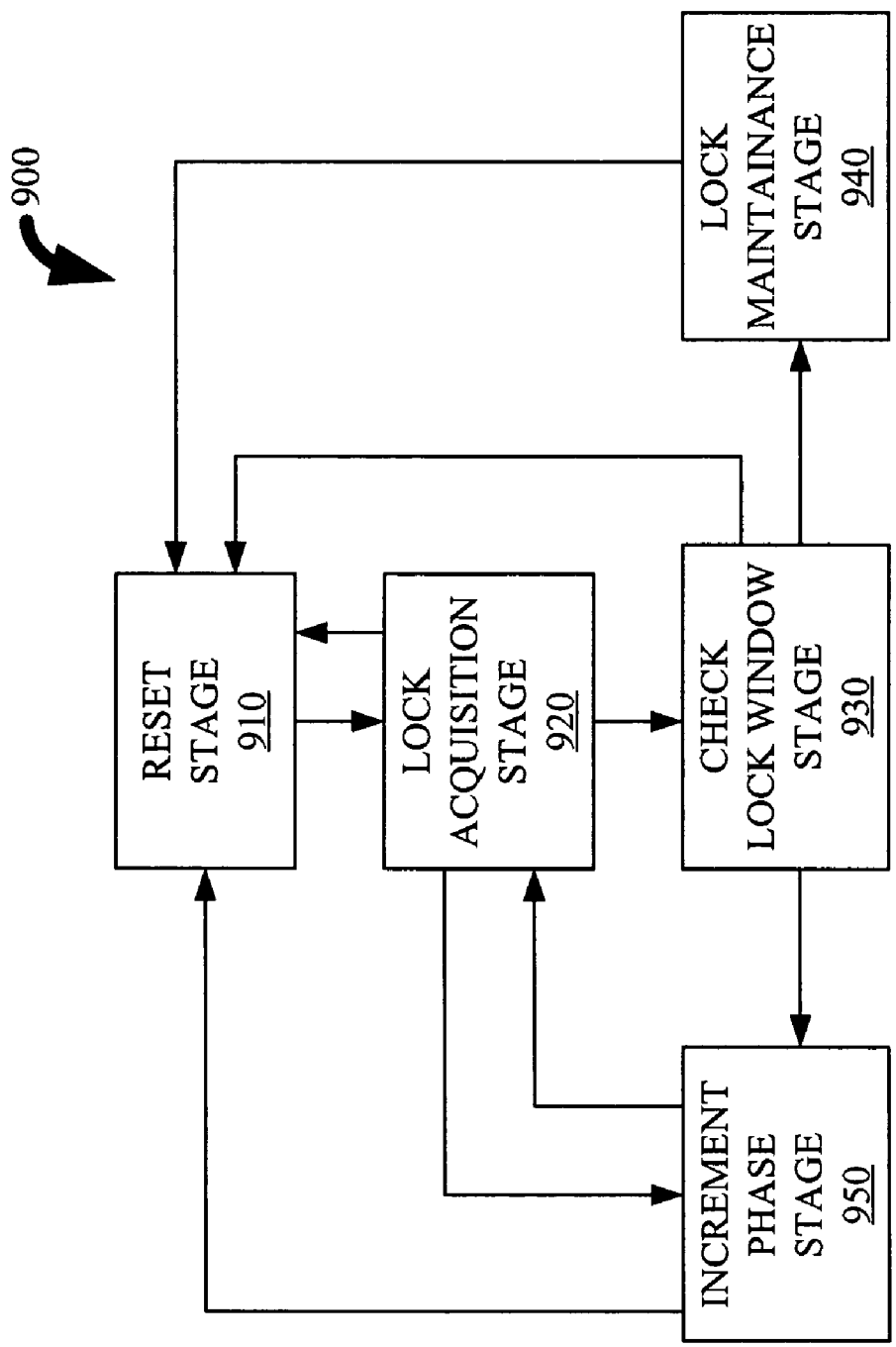
FIG. 9 is a state diagram for an embodiment of a controller in accordance with the present invention.

FIG. 9 shows a state diagram 900 for one embodiment of controller 330 of FIG. 3. On power-up or reset, controller 330 transitions to reset stage 910. In reset stage 910, controller 330 sets a phase counter (not shown) to zero, which causes output generator 340 to provide delayed clock signal D_CLK as output clock signal O_CLK, and adjusts propagation delay D of delay line 310 (FIG. 3) to a starting delay value. Starting delay values for propagation delay D include, for example, minimum propagation delay D_MIN, maximum propagation delay D_MAX, or the average of minimum propagation delay D_MIN and maximum propagation delay D_MAX. Controller 910 then transitions to lock acquisition stage 920.

In lock acquisition stage 920, controller 330 synchronizes reference clock signal REF_CLK and skewed clock signal S_CLK. Specifically, controller 330 adjusts propagation delay D of delay line 310 based on signals from phase detector 320. Phase detector 320 determines whether propagation delay D must be increased or decreased to synchronize skewed clock signal S_CLK with reference clock signal REF_ CLK. Lock acquisition is described above in greater detail with respect to FIGS. 3-6; therefore, the description is not repeated. In some embodiments, clock phase shifter 350 is also reset by the power-on/reset signal. For some of these embodiments, controller 330 does not adjust propagation delay D until after clock phase shifter 350 produces phase-shifted clock signals P_CLK_1 to P_CLK_N-1. If controller 330 cannot synchronize skewed clock signal S_CLK with reference clock signal REF_CLK, controller 330 transitions to increment phase stage 950, described below. Otherwise, controller 330 transitions to check lock window stage 930 after controller 330 synchronizes skewed clock signal S_CLK with reference clock signal REF_CLK (with an initial propagation delay ID in delay line 310).

In check lock window stage 930, controller 330 must determine whether initial propagation delay ID is within lock window W. Specifically, propagation delay ID is within lock window W if propagation delay ID is greater than lock window minimum W_MIN and less than lock window maximum W_MAX. If initial propagation delay ID is not within lock window W, controller 330 transitions to increment phase stage 950. Otherwise, controller 330 transitions to lock maintenance stage 940.

In lock maintenance stage 940, controller 330 adjust propagation delay D of delay line 310 to maintain synchronization of skewed clock signal S_CLK with reference clock signal REF_CLK. Lock maintenance is described above in greater detail; therefore, the description is not repeated. As described above, the present invention can maintain lock throughout the systems environment conditions. Therefore, controller 330 remains in lock maintenance stage 940 unless a reset occurs that causes controller 330 to transition to reset stage 910.

In increment phase stage 950, controller 330 increments the phase counter, which causes output generator 340 to select a different phase-shifted clock signal. Further, controller 330 resets delay line 310 so that propagation delay D returns to the starting delay value used in reset stage 910. Controller 330 then transitions to lock acquisition stage 920 and proceeds as described above.

Figure 10:
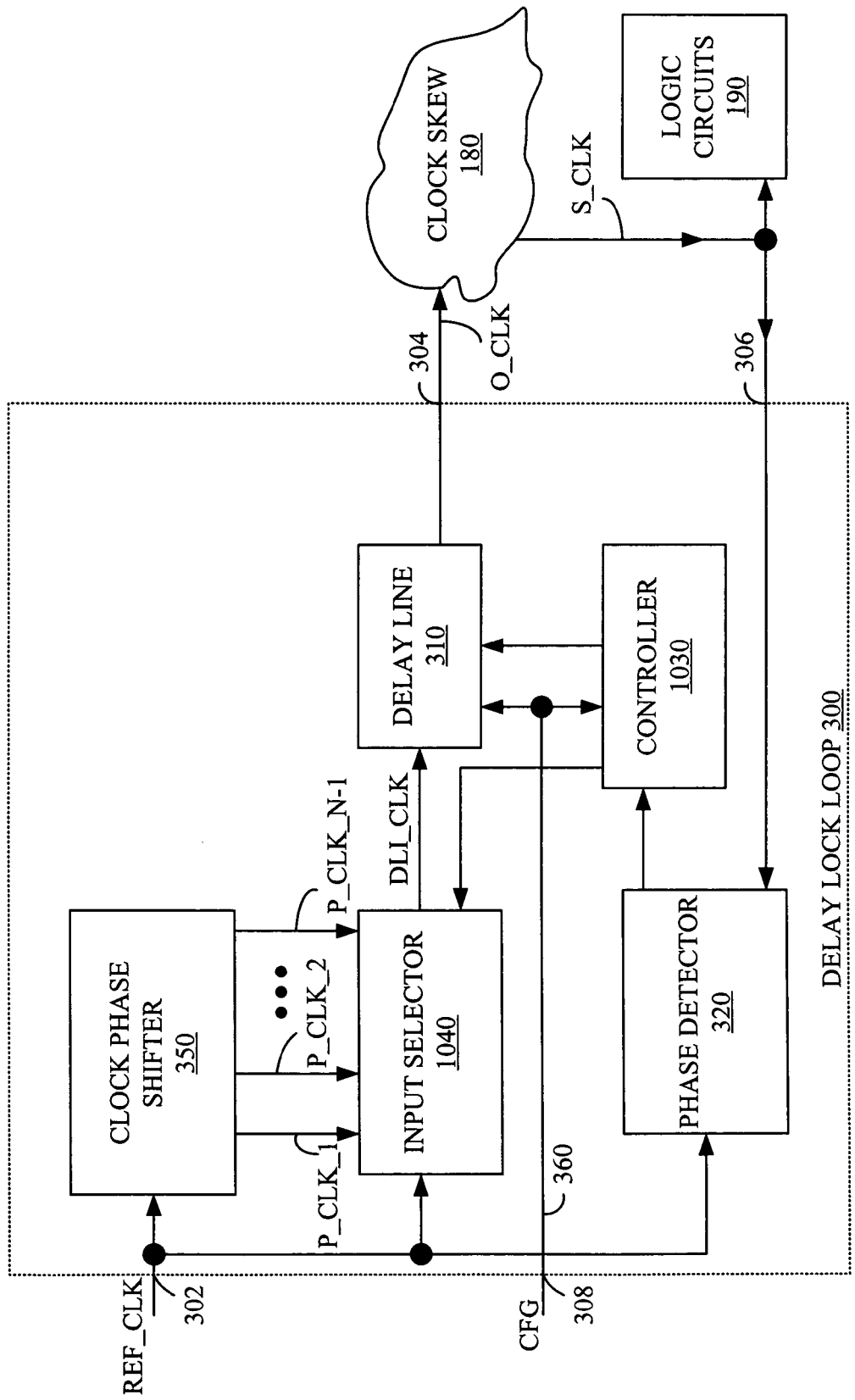
FIG. 10 is a block diagram of a system using another embodiment of a delay lock loop in accordance with the present invention.

FIG. 10 is a block diagram of another embodiment of delay lock loop 300. The embodiment of FIG. 10 uses the same principles as described above with respect to the embodiment of FIG. 3. However, in the embodiment of FIG. 10, clock phase shifter 350 generates phase-shifted clock signals P_CLK_1 to P_CLK_N-1 using reference clock signal REF_CLK. Reference clock signal REF_CLK and phase-shifted clock signals P_CLK_1 to P_CLK_N-1 are coupled to an input selector 1040. Input selector 1040 selects either reference clock signal REF_CLK or one of phase-shifted clock signals P_CLK_1 to P_CLK_N-1 as a delay line input clock signal DLI_CLK, which is provided to the input terminal of delay line 310. Delay line 310 drives output clock signal O_CLK. A controller 1030 controls input selector 1040 and delay line 310 based on the phase information provided by phase detector 320 so that delay line 310 provides a propagation delay D that synchronizes skewed clock signal S_CLK with reference clock signal REF_CLK. Input selector 1040 can be implemented using the same circuit design as output generator 340.

In the various embodiments of the present invention, novel structures have been described for delay lock loops. By using a clock phase shifter to provide propagation delays proportional to the period of a clock signal, the present invention can provide clock signal control of the initial propagation delay at lock acquisition. By accepting only initial propagation delays within a lock window, the present invention can maintain synchronization of the clock signals over the entire range of environmental conditions of a system using the present invention. Further, since the clock phase shifter provides propagation delays proportional to the period of the clock signal, the present invention is applicable to systems using both high and low frequency clock signals. In addition, the delay lock loop of the present invention can be implemented with purely digital circuits that can be completely incorporated on a single silicon chip such as an FPGA, a DSP chip, or a microprocessor.

Figure 11:
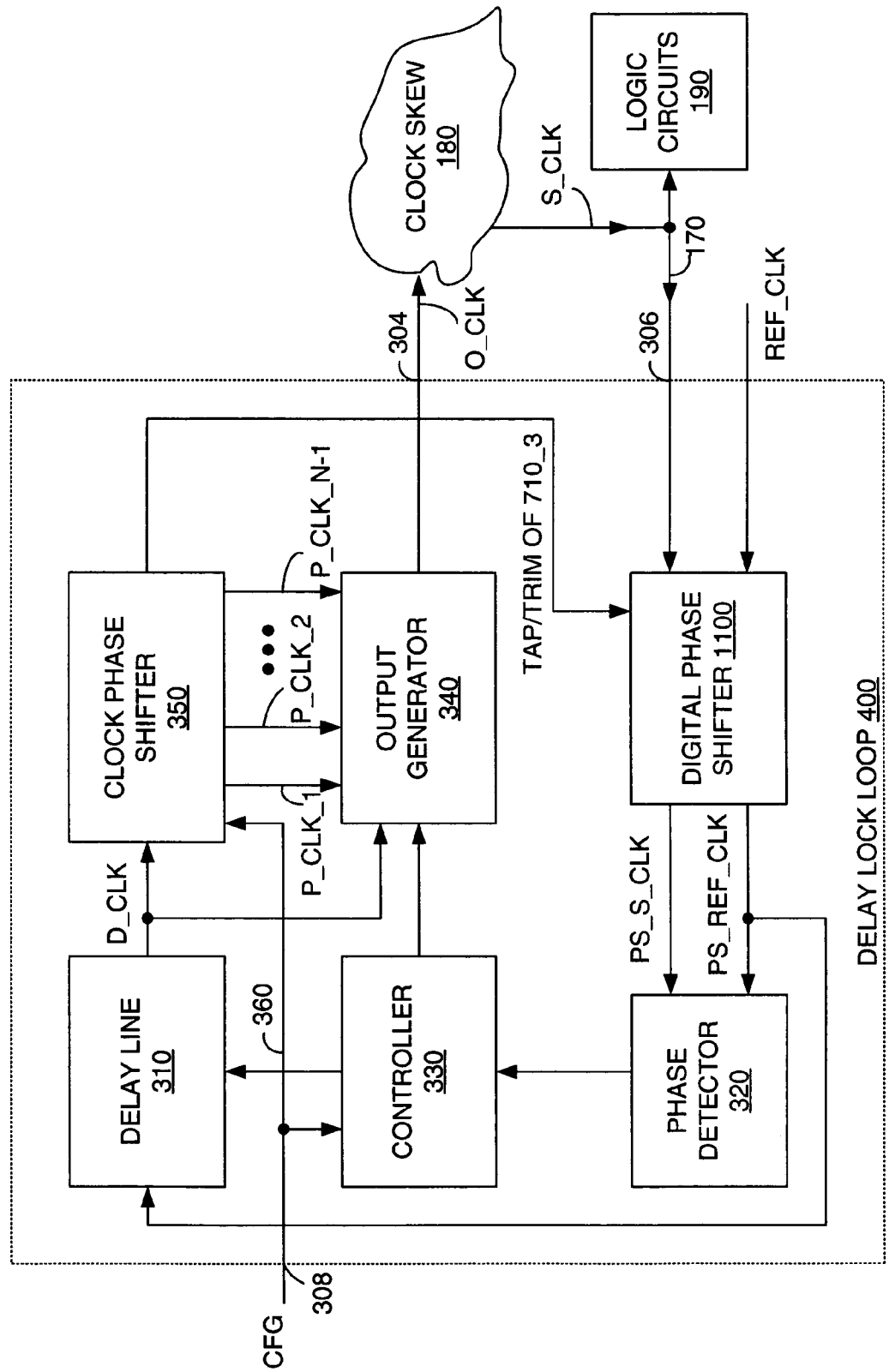
FIG. 11 is a block diagram of a delay lock loop, which can be used in place of the delay lock loop of FIG. 3, in accordance with another embodiment of the present invention.

FIG. 11 is a block diagram of a delay lock loop 400, which can be used in place of delay lock loop 300, in accordance with another embodiment of the present invention. Because delay lock loop 400 (FIG. 11) is similar to delay lock loop 300 (FIG. 3), similar elements in FIGS. 3 and 11 are labeled with similar reference numbers. Thus, delay lock loop 400 includes delay line 310, phase detector 320, controller 330, output generator 340, and clock phase shifter 350. In addition, delay lock loop 400 includes digital phase shifter 1100, which enables the skew clock signal S_CLK to have a leading or lagging relationship with respect to the reference clock signal REF_CLK.

Within delay lock loop 400, both the reference clock signal REF_CLK and the skew clock signal S_CLK are applied to input terminals of digital phase shifter 1100. In response, digital phase shifter 1100 provides phase shifted reference clock signal PS_REF_CLK and phase shifted feedback clock signal PS_S_CLK. The phase shifted reference clock signal PS_REF_CLK is provided to input terminals of delay line 310 and phase detector 320. Thus, the PS_REF_CLK signal of delay lock loop 400 is routed in the same manner as the reference clock signal REF_CLK of delay lock loop 300. The phase shifted feedback clock signal PS_S_CLK is provided to an input terminal of phase detector 320. Thus, the PS_S_CLK signal of delay lock loop 400 is routed in the same manner as the skew clock signal S_CLK of delay lock loop 300.

As described in more detail below, digital phase shifter 1100 adjusts the phase relationship of the REF_CLK and S_CLK signals to provide the PS_REF_CLK and PS_S_CLK signals, respectively. As a result, the S_CLK signal can be controlled to have a leading or lagging phase relationship with respect to the REF_CLK signal.

Figure 12:
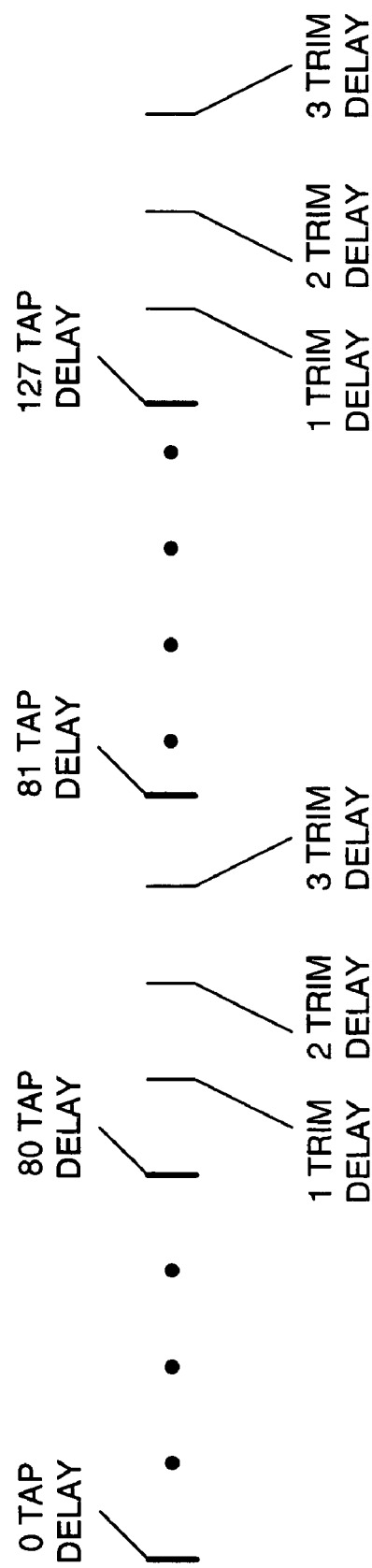
FIG. 12 is a schematic diagram illustrating the tap/trim delays for selected sections of a delay line in the clock phase shifter of FIG. 7.

In the described embodiment, clock phase shifter 350 is configured in the manner illustrated in FIG. 7 (i.e., N=4). Each of the delay lines 710_1, 710_2, 710_3 and 710_4 includes 128 tap delays and a trim delay circuit. The trim delay circuit can be controlled to add up to 3 trim delays between tap delays. Delay line 710_3 therefore has 512 (128+3*128) possible tap/trim delay settings. FIG. 12 illustrates the tap/trim delays for selected sections of delay line 710_3. Circuitry for providing the tap/trim delays is described in U.S. Pat. No. 6,400,735, entitled "Glitchless Delay Line Using Gray Code Multiplexer", which is referenced above, and in commonly assigned, co-pending U.S. patent application entitled "Digital Clock Manager Capacitive Trim Unit" by Shawn K. Morrison et al., filed on the date hereof, and incorporated in its entirety herein by reference.

Phase detector 720 controls each of the delay lines 710_1, 710_2, 710_3 and 710_4 to have the same tap/trim setting (+/−1 trim delay). When the configuration signal CFG has a logic "1" value (i.e., delay lock loop 400 is configured in a low frequency mode), all four of the delay lines 710_1, 710_2, 710_3 and 710_4 are coupled in series. As a result, the delay selected by the tap/trim setting of each of the delay lines corresponds with approximately one-quarter cycle of the D_CLK signal.

Similarly, when the configuration signal CFG has a logic "0" value (i.e., delay lock loop 400 is configured in a high frequency mode), the two delay lines 710_1 and 710_3 are coupled in series. As a result, the delay selected by the tap/trim setting of each of the delay lines 710_1 and 710_3 corresponds with approximately one-half cycle of the D_CLK signal.

Clock phase shifter 350 provides the tap/trim setting of delay line 710_3 to digital phase shifter 1100, thereby providing digital phase shifter 1100 with a signal that corresponds with the period of the D_CLK signal. As described in more detail below, this information is used to select the phase shift introduced by digital phase shifter 1100.

Figure 13:
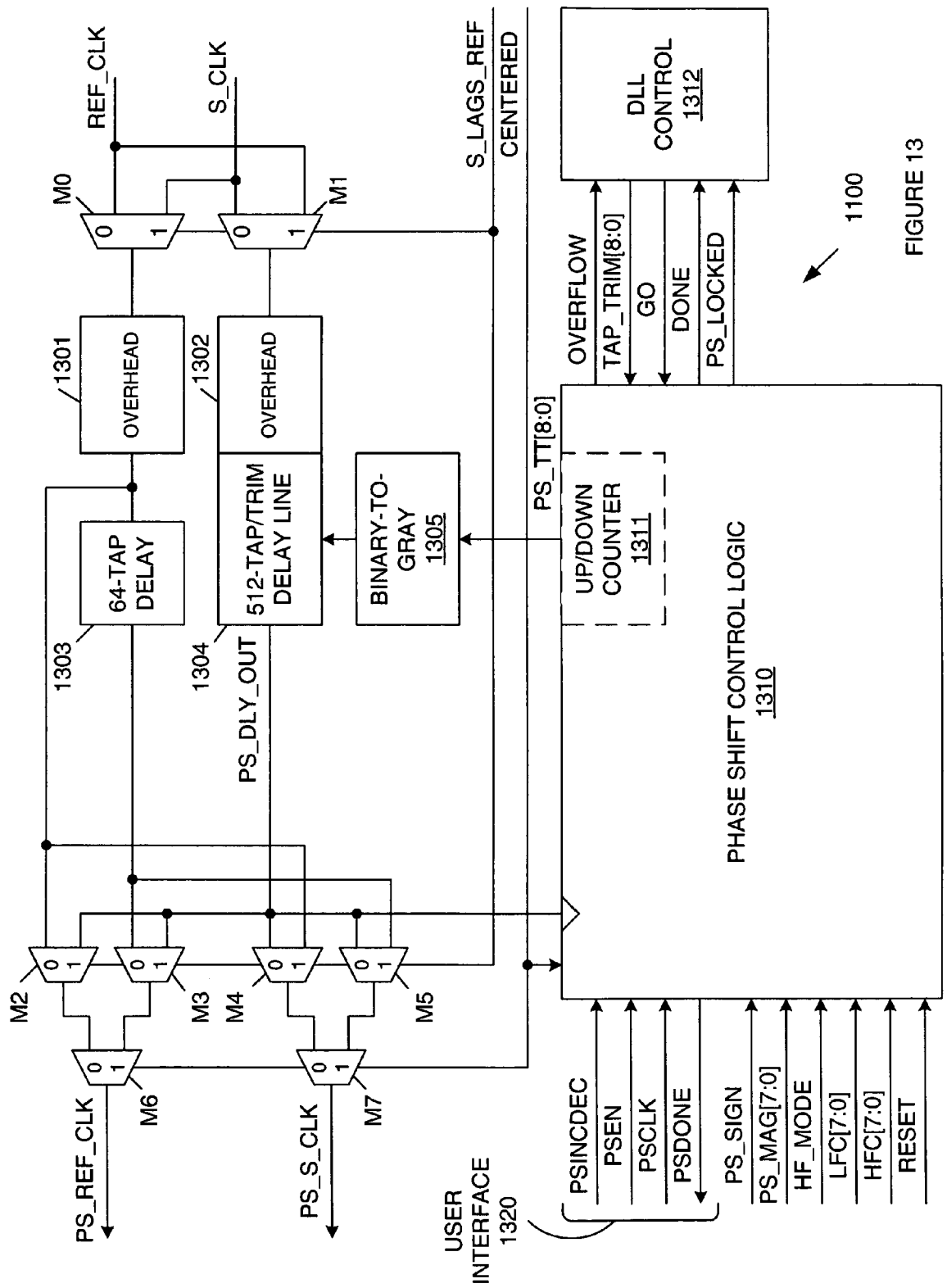
FIG. 13 is a block diagram of a digital phase shifter in accordance with one embodiment of the present invention.

FIG. 13 is a block diagram of digital phase shifter 1100 in accordance with one embodiment of the present invention. Digital phase shifter 1100 includes multiplexers M0-M7, overhead delay circuits 1301-1302, 64-tap delay circuit 1303, adjustable 512-tap/trim delay line 1304, binary-to-gray decoder 1305, phase shift control logic 1310 (which includes up/down counter 1311) and DLL control circuitry 1312.

Digital phase shifter 1100 is controlled as follows. First, digital phase shifter 1100 is selected to operate in one of four modes. These four modes include a first fixed mode, a second fixed mode, a first variable mode and a second variable mode. In the first fixed mode, digital phase shifter 1100 introduces delay to the skew clock signal. For example, digital phase shifter 1100 can be controlled to introduce a delay in the range of 0 to 511 tap/trim units to the skew clock signal in the first fixed mode. In the second fixed mode, digital phase shifter 1100 introduces delay to the reference clock signal. For example, digital phase shifter 1100 can be controlled to introduce a delay in the range of 0 to 511 tap/trim units to the reference clock signal in the second fixed mode. In the first variable mode, digital phase shifter 1100 can be controlled to introduce a delay equal to 255 to −255 tap/trim units to the reference clock signal. In the second variable mode, digital phase shifter 1100 can be controlled to introduce a delay equal to 255 to −255 tap/trim units to the skew clock signal.

The mode is selected in response to the S_LAGS_REF and CENTERED control signals. The CENTERED control signal is de-asserted low, and the S_LAGS_REF signal is de-asserted low to indicate that the S_CLK signal will lead the REF_CLK signal in the first fixed mode. Conversely, the CENTERED control signal is de-asserted low, and the S_LAGS_REF signal is asserted high to indicate that the S_CLK signal will lag the REF_CLK signal in the second fixed mode. The CENTERED control signal is asserted high and the S_LAGS_REF signal is asserted high to enable the first variable mode. The CENTERED control signal is asserted high and the S_LAGS_REF signal is de-asserted low to enable the second variable mode. In one embodiment, these control signals are provided by configuration memory bits of a programmable logic device, although this is not necessary.

Figure 14A:
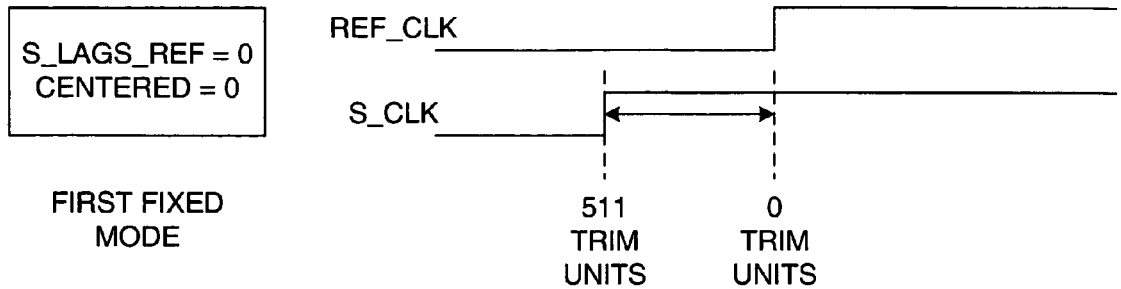
FIGS. 14A and 14B are waveform diagrams illustrating reference clock and skew clock signals for a first fixed mode and a second fixed mode, respectively, of the delay lock loop of FIG. 11.

FIG. 14A is a waveform diagram illustrating the REF_CLK and S_CLK signals for the first fixed mode. To enter the first fixed mode, the S_LAGS_REF control signal is de-asserted to a logic "0" state, and the CENTERED control signal is de-asserted to a logic "0" state. Under these conditions, the REF_CLK signal is routed through multiplexers M0, M2 and M6 and overhead delay circuit 1301 to provide the PS_REF_CLK signal. The S_CLK signal is routed through multiplexers M1, M4 and M7, overhead delay circuit 1302 and 512-tap/trim delay line 1304 to provide the PS_S_CLK signal. Overhead delay circuits 1301 and 1302 introduce the same delay to the applied signals. Thus, if the 512-tap/trim delay line 1304 is set to have zero delay, then the REF_CLK signal and the S_CLK signal will have identical delays through digital phase shifter 1100.

Delay lock loop 400 will always cause the PS_REF_CLK and the PS_S_CLK signals to be synchronized. As a result, any phase shifting introduced by delay elements 1301-1304 is realized by the REF_CLK and S_CLK signals. In the first fixed mode, if the delay introduced by 512-tap/trim delay line 1304 is increased, then the REF_CLK signal will lag the S_CLK signal. The 512-tap/trim delay line 1304, which is identical to delay line 710_3 (FIG. 7), can be configured to provide a maximum tap/trim delay of 511 trim units (thereby providing a maximum lag for the REF_CLK signal).

Figure 14B:
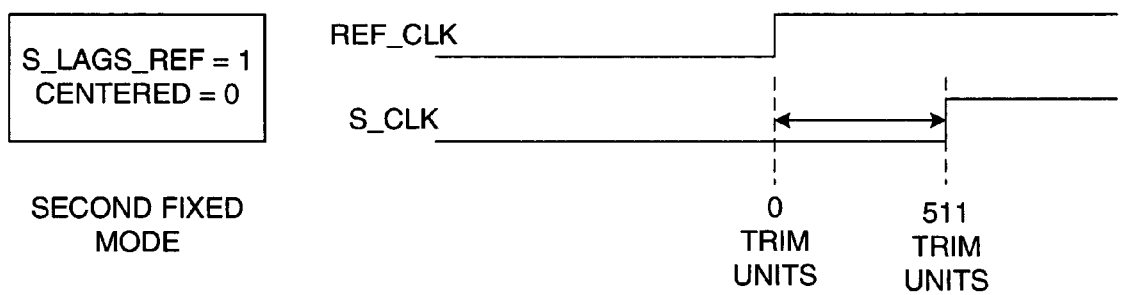

FIG. 14B is a waveform diagram illustrating the REF_CLK and S_CLK signals for the second fixed mode. To enter the second fixed mode, the S_LAGS_REF control signal is asserted to a logic "1" state, and the CENTERED control signal is de-asserted to a logic "0" state. Under these conditions, the REF_CLK signal is routed through multiplexers M1, M2 and M6, overhead delay circuit 1302 and 512-tap/trim delay line 1304 to provide the PS_REF_CLK signal. The S_CLK signal is routed through multiplexers M0, M4 and M7 and overhead delay circuit 1301 to provide the PS_S_CLK signal. If the 512-tap/trim delay line 1304 is set to have zero delay, then the REF_CLK signal and the S_CLK signal will have identical delays through digital phase shifter 1100.

In the second fixed mode, if the delay introduced by 512-tap/trim delay line 1304 is increased, then the REF_CLK signal will begin to lead the S_CLK signal. When the 512-tap/trim delay line 1304 is configured to provide a maximum tap/trim delay of 511 trim units, a maximum phase lead will be provided for the REF_CLK signal.

Figure 14C:
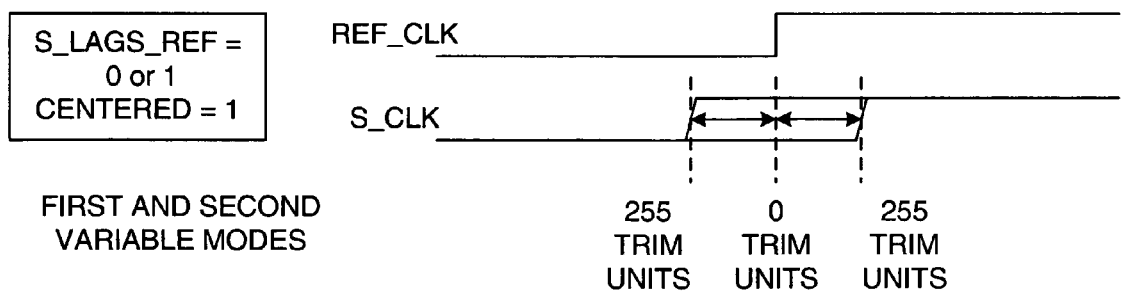
FIG. 14C is a waveform diagram illustrating reference clock and skew clock signals for a first and second variable mode of the delay lock loop of FIG. 11.

FIG. 14C is a waveform diagram illustrating the REF_CLK and S_CLK signals for the first and second variable modes. To enter the first variable mode, the CENTERED control signal is asserted to a logic "1" state and the S_LAGS_REF control signal is asserted to a logic "1" state. As a result, the REF_CLK signal is routed through multiplexers M1, M3 and M6, overhead delay circuit 1302 and 512-tap/trim delay line 1304 to provide the PS_REF_CLK signal. The S_CLK signal is routed through multiplexers M0, M5 and M7, overhead delay circuit 1302 and 64-tap delay line 1303. The 64-tap delay circuit 1303 provides a fixed delay equal to half of the maximum delay of 512-tap/trim delay line 1304 (or delay line 710_3). The 512-tap/trim delay line 1304 is initially set to a delay equal to zero trim units, and is incremented to a delay equal to 64-taps (256 trim units). At this time, the delays through delay circuits 1303 and 1304 are initially matched (i.e., there is a zero phase shift). The delay introduced by the 512-tap/trim delay line 1304 can be increased greater than the 64 tap delay, thereby causing the S_CLK signal to lag the REF_CLK signal. Conversely, the delay introduced by the 512-tap/trim delay line 1304 can be reduced to less than the 64 tap delay, thereby causing the S_CLK signal to lead the REF_CLK signal. Because zero phase shift is obtained at the mid-point of delay line 1304 (i.e., at 256 trim units), this delay line 1304 can only provide an additional 255 trim units of delay in each direction in the first variable mode.

FIG. 14C also represents the REF_CLK and S_CLK signals for the second variable mode. To enter the second variable mode, the CENTERED control signal is asserted to a logic "1" state and the S_LAGS_REF control signal is asserted to a logic "0" state. As a result, the REF_CLK signal is routed through multiplexers M0, M3 and M6, overhead delay circuit 1301 and 64-tap delay line 1303 to provide the PS_REF_CLK signal. The S_CLK signal is routed through multiplexers M1, M5 and M7, overhead delay circuit 1302 and 512-tap/trim delay line 1304. The 512-tap/trim delay line 1304 is initially set to a delay equal to zero trim units, and is incremented to a delay equal to 64-taps (256 trim units). At this time, the delays through delay circuits 1303 and 1304 are initially matched (i.e., there is a zero phase shift). The delay introduced by the 512-tap/trim delay line 1304 can be increased greater than the 64 tap delay, thereby causing the S_CLK signal to lead the REF_CLK signal. Conversely, the delay introduced by the 512-tap/trim delay line 1304 can be reduced to less than the 64 tap delay, thereby causing the S_CLK signal to lag the REF_CLK signal. The second variable mode is similar to the first variable mode. However, in the first variable mode, 512-tap/trim delay line 1304 is in line with the REF_CLK signal, and in the second variable mode, the 512-tap/trim delay line 1304 is in line with the S_CLK signal. In the described embodiments, the first variable mode is preferred for the following reason. If the 512-tap/trim delay line 1304 is in line with the S_CLK signal, then delay line 310 will subsequently need to compensate for adjustments made by delay line 1304, thereby reducing the number of available tap adjustments remaining in delay line 310.

Delay lock loop 400 operates as follows in accordance with one embodiment of the present invention.

Initially, configuration memory bits are set to define the states of the S_LAGS_REF and CENTERED control signals, thereby defining whether digital phase shifter 1100 will operate in the first fixed mode (REF_CLK lagging S_CLK), the second fixed mode (REF_CLK leading S_CLK) or the first or second variable mode.

Configuration memory bits are also set to define the states of the PS_SIGN, PS_MAG[7:0], HF_MODE, LFC and HFC control signals. The PS_MAG[7:0] control signal identifies the magnitude of the phase shift to be introduced by digital phase shifter 1100. The PS_SIGN control signal is used to identify the polarity of the PS_MAG[7:0] signal when digital phase shifter 1100 is configured in the variable mode (i.e., CENTERED=1). When digital phase shifter 1100 is configured in a fixed mode, the PS_SIGN control signal is not used. If the PS_SIGN signal has a logic "1" state (indicating a negative polarity), the PS_MAG[7:0] signal cannot have a logic 0 value, because the PS_MAG[7:0] signal is represented in 2's complement in the present embodiment.

The HF_MODE control signal is set to a logic "0" value when digital phase shifter 100 is operating in response to low frequency clock signals, where all four delay lines 710_1-710_4 are required to create one full period. Conversely, the HF_MODE control signal is set to a logic "1" value when digital phase shifter 1100 is operating in response to high frequency clock signals, where only two delay lines 710_1 and 710_3 are sufficient to create one full period. The HF_MODE control signal is used to select a low frequency mode constant LFC[7:0] or a high frequency mode constant HFC[7:0].

The low frequency mode constant LFC[7:0] represents the overhead of the signal path in trim units through the delay chain located in clock phase shifter 350 (FIG. 7), when the CFG signal has a logic "1" value and all of the tap/trim settings in delay lines 710_1-710_4 are set to zero.

Similarly, the high frequency mode constant HFC[7:0] represents the overhead of the signal path in delay units through the delay chain located in clock phase shifter 350 (FIG. 7), when the CFG signal has a logic "0" value and all of the tap/trim settings in delay lines 710_1 and 710_3 are set to zero. The low frequency mode constant LFC[7:0] and the high frequency mode constant HFC[7:0] are determined by Spice simulation in the described embodiment.

After the above-described constants have been set, the RESET signal is asserted, thereby resetting up/down counter 1311 to a value corresponding with zero tap/trim delay in delay line 1304. Delay line 310 is also set to a value corresponding with zero tap/trim delay. These settings are maintained until after clock phase shifter 350 achieves a locked condition. More specifically, the REF_CLK signal is routed through digital phase shifter 1100 and delay line 310, and is provided to clock phase shifter 350 (as the D_CLK signal). In response, clock phase shifter 350 operates in the manner described above in connection with FIG. 7 to achieve a locked condition with respect to the REF_CLK signal. Note that digital phase shifter 1100 and delay line 310 are prevented from adjusting their delay lines while clock phase shifter 350 is locking using the REF_CLK signal. After clock phase shifter 350 has achieved a locked condition, the tap/trim setting of delay line 710_3 is representative of either ¼ of the period (low frequency mode) or ½ of the period (high frequency mode) of the reference clock signal REF_CLK. At the end of this state, the tap/trim setting of delay line 710_3 is provided to phase shift control logic 1310 as the TAP_TRIM [8:0] signal. The RESET signal is de-asserted after the clock phase shifter 350 is locked.

After the RESET signal is de-asserted, digital phase shifter 1100 is allowed to adjust delay line 1304. However, while digital phase shifter 1100 is adjusting delay line 1304, clock phase shifter 350 and delay line 310 are prevented from adjusting their delay lines. Digital phase shifter 1100 increments counter 1311 to provide the initial setting of 512-tap/trim delay line 1304. The initial setting of 512-tap/trim delay line 1304 is calculated as a function of the TAP_TRIM[8:0] signal and the PS_SIGN and PS_MAG[6:0] values. Up/down counter 1311 is incremented (or decremented) until the count of this counter 1311 matches the calculated initial setting. This count is transparently passed to 512-tap/trim delay line 1304 through binary-to-gray code converter 1305. Binary-to-gray code converter is described in more detail in U.S. Pat. No. 6,400,735, referenced above.

More specifically, the initial setting of 512-tap/trim delay line 1304 is determined by first determining an equivalent tap/trim per period (ETT/P). For low frequency mode, ETT/P is determined by the following equation.

$$ETT/P = (4 \times (TAP\_TRIM[8:0])) + LFC[7:0] \quad (6)$$

For high frequency mode, ETT/P is determined by the following equation.

$$ETT/P = (2 \times (TAP\_TRIM[8:0])) + HFC[7:0] \quad (7)$$

The initial setting of 512-tap/trim delay line 1304 is then determined from the ETT/P value in the following manner. For the first and second fixed modes of operation, the initial tap/trim setting of 512-tap/trim delay line 1304 is equal to:

$$(PS\_MAG[7:0]/256) \times ETT/P \quad (8)$$

For the first and second variable modes of operation, the initial tap/trim setting of 512-tap/trim delay line 1304 is equal to:

$$256+((PS\_MAG[7:0]/256) \times ETT/P); \qquad (9)$$

If PS_SIGN=0 or $$256-((PS\_MAG[7:0]/256) \times ETT/P); \qquad (10)$$

If PS_SIGN=1.

Because there is only one delay line 1304 in digital phase shifter 1100, the maximum value of PS_MAG[7:0]/256 is less than approximately ¼ and ½ of the longest period, for the low and high frequency modes, respectively.

After the initial tap/trim setting of 512-tap/trim delay line 1304 has been set, digital phase shifter 1100 and clock phase shifter 350 are temporarily prevented from adjusting their delay lines. At this time, delay line 310 is released, thereby enabling delay line 310 to be adjusted, such that the PS_REF_CLK and the PS_S_CLK signals are synchronized. That is, delay line 310 is allowed to achieve a locked condition. At this time, the S_CLK and REF_CLK signals exhibit a skew corresponding with the delay introduced by 512-tap/trim delay line 1304. In general processing continues in the above-described manner, such that during the next state, clock phase shifter 350 is allowed to lock, while delay line 1304 in digital phase shifter 1100 and delay line 310 are held at their previously determined values. During the next state, delay line 1304 of digital phase shifter 1100 is allowed to lock (using the TAP_TRIM[8:0] signal determined by clock phase shifter 350 during the previous state), while delay line 310 and the delay line in clock phase shifter 350 are held at their previously determined values. During the next state, delay line 310 is allowed to lock, while delay line 1304 of digital phase shifter 1100 and the delay line in clock phase shifter 350 are held at their previously determined values. By allowing only one of delay line 310, clock phase shifter 350 and digital phase shifter 1100 to adjust their delay lines at any given time, contention is prevented between delay line 310, clock phase shifter 350 and digital phase shifter 1100.

A more detailed description of the state machine used to control delay line 310, clock phase shifter 350 and digital phase shifter 1100 is provided in Appendix A.

As described above, the tap/trim setting of 512-tap/trim delay line 1304 is periodically recalculated, using the current TAP_TRIM[8:0] value provided by delay line 710_3 of clock phase shifter 350. Up/down counter 1311 is incremented, unchanged, or decremented, depending on whether the new TAP_TRIM[8:0] value is greater, the same or less than the old TAP_TRIM[8:0] value, respectively. As described above, a delay lock loop manager (not shown) ensures that delay line 310 and clock phase shifter 350 never check phase on a cycle that is temporarily extended or shortened by a trim change implemented within 512-tap/trim delay line 1304.

The tap/trim setting of delay line 1304 can also be modified by the user of delay lock loop 400 through a user interface 1320. User interface 1320 includes the phase increment/decrement signal PSINCDEC, the phase shift enable signal PSEN, the phase shift clock signal PSCLK and the phase shift done signal PSDONE, which are provided to phase shift control logic 1310. The PSCLK signal is different than the PS_DLY_OUT clock signal, thereby requiring the coordination of these two clock domains within phase shift control logic 1310. The PSEN signal is asserted high for one cycle of the PSCLK signal. At the same time, or prior to this cycle, the PSINCDEC signal is asserted high or low, thereby causing the numerator of the fraction in equations (8), (9) or (10) to be incremented or decremented by one, respectively. If the increment or decrement in the numerator is sufficient to warrant a change in the count value in up/down counter 1311, then this change is implemented. When digital phase shifter 1100 has completed the increment or decrement operation, phase shift control logic 1310 asserts the PSDONE signal for one cycle of the PSCLK signal, thereby indicating to the user that the tap/trim setting of delay line 1304 can be modified again.

Figure 15:
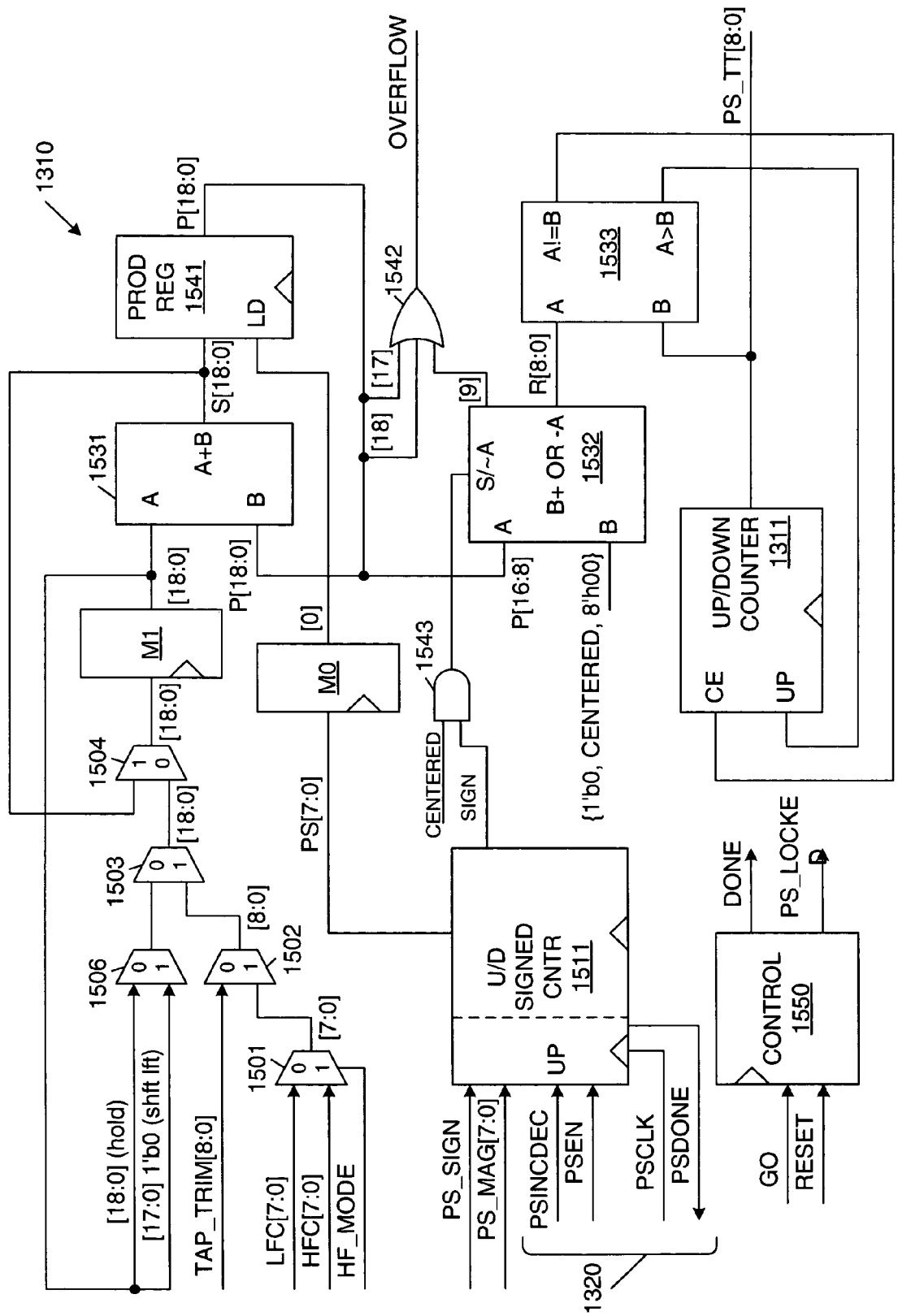
FIG. 15 is a block diagram illustrating phase shift control logic of FIG. 13 in more detail.

FIG. 15 is a block diagram illustrating phase shift control logic 1310 in more detail. In the described embodiment, phase shift control logic 1310 includes multiplexers 1501-1506, up/down signed counter 1511, registers M0-M1, adder 1531, bias adder/subtractor 1532, comparator block 1533, product register 1541, OR gate 1542, AND gate 1543, control block 1550 and up/down counter 1311.

Phase shift control logic 1310 performs the mathematics to convert the TAP_TRIM[8:0], LFC[7:0], HFC[7:0], PS_SIGN and PS_MAG[7:0] signals to the PS_TT[8:0] value, such that the phase shift delay introduced by delay line 1304 is the desired fractional part of the clock period. Phase shift control logic 1310 also includes a user interface 1320 that allows dynamic phase adjustments, and an interface to DLL control 1312.

DLL control 1312 specifies when phase shift control logic 1310 may change the PS_TT[8:0] signal. DLL control 1312 does this with an asynchronous 4 wave front handshake cycle between the GO signal (a request from DLL control 1312) and the DONE signal (a response from phase shift control logic 1310).

The first GO signal asserted after the RESET signal causes the PS_TT[8:0] signal to increment from zero to the correct initial setting. On subsequent cycles, the PS_TT[8:0] signal is unchanged, increased, or decreased to maintain the correct delay (i.e., the currently specified fractional portion of the REF_CLK period).

A primary state machine of phase shift control logic 1310 remains dormant until the GO signal is received from DLL control 1312. After the GO signal is captured and synchronized to the local clock signal, this primary state machine is used to calculate the current PS_TT[8:0] per equations (6)-(10) provided above. When the calculation and PS_TT update is completed, the DONE signal is activated to inform DLL control 1312 that the operation is complete. After the primary state machine is started, control proceeds to the next state after one clock cycle, unless otherwise noted. The various states of the primary state machine will now be described.

During an IDLE state, the PS_SIGN and PS_MAG[7:0] signals are loaded into up/down signed counter 1511. Signed counter 1511 provides the PS_SIGN signal as the SIGN signal, and the PS_MAG[7:0] signal as the PS[7:0] signal. The PS[7:0] signal is loaded into register M0.

In addition, the HF_MODE signal causes either the HFC[7:0] value or the LFC[7:0] value to be routed through multiplexer 1501. In the described example, the HF_MODE signal has a logic "0" value (low frequency mode), thereby causing the LFC[7:0] value to be passed. Multiplexers 1502, 1503 and 1504 are controlled to pass the LFC[7:0] value from the output of multiplexer 1501 to register M1. The LFC[7:0] value is loaded into register M1, thereby completing the IDLE state.

The primary state machine then enters an M1_TO_PROD state, in which the contents of register M1 are transferred into product register 1541. Note the product register 1541 was initially reset to store a logic zero value. Adder 1531 initially adds this initial zero value (on the B input terminal of adder 1531) to the contents of register M1 (on the A input terminal of adder 1531). The result (i.e., the LFC[7:0] constant) is loaded into product register 1541, thereby completing the M1_TO_PROD state.

The primary state machine then enters a TAP_TRIM_TO_M1 state, where the TAP_TRIM[8:0] signal is loaded into register M1. The primary state machine controls the multiplexers 1502-1504 to route the TAP_TRIM[8:0] signal to register M1.

The primary state machine then enters a SHIFT1 state, in which the TAP_TRIM[8:0] signal is multiplied by 2. This is accomplished by routing the TAP_TRIM[8:0] signal from the output of register M1 to the "1" input terminal of multiplexer 1506. This path shifts the TAP_TRIM[8:0] signal left by one bit, thereby effectively multiplying the TAP_TRIM[8:0] signal by 2. This corresponds with the multiply by 2 function described above in equation (7). The shifted TAP_TRIM[8:0] signal is routed through multiplexers 1506, 1503 and 1504 and is re-loaded into register M1.

If the HF_MODE signal has a logic "0" state (i.e., low frequency mode), then the primary state machine enters a SHIFT2 state, in which the TAP_TRIM[8:0] signal is again multiplied by 2 (thereby providing the multiply by four function required by equation (6)). The multiply by 2 operation of the SHIFT2 state is performed in the same manner as the multiply by 2 operation of the SHIFT1 state. If the HF_MODE signal has a logic "1" state (i.e., high frequency mode), then the primary state machine skips the SHIFT2 state.

The primary state machine then enters a ETTP_TO_M1 state, in which the shifted TAP_TRIM[8:0] signal stored in register M1 is added to the LFC[7:0] constant stored in product register 1541, thereby creating the ETT/P value. To accomplish this, adder 1531 is controlled to add the contents of register M1 (i.e., the shifted TAP_TRIM[8:0] value) and the contents of product register 1541 (i.e., the LFC[7:0] constant). The result (i.e., the ETT/P value) is routed through multiplexer 1504 and loaded into register M1.

The primary state machine then enters a RST_PROD state, in which the contents of product register 1541 are reset to a zero value.

The primary state machine then enters a MULTIPLY state, in which the ETT/P value stored in register M1 is multiplied by the PS[7:0] value stored in register M0. The 19-bit adder 1531 is used to multiply these values, using an iterative add and shift method. Thus, adder 1531 initially adds zero to the ETT/P value, such that the ETT/P value is initially provided to the input terminal of product register 1541. At this time, the PS[0] bit is provided to the load terminal of product register 1541. If the PS[0] bit has a logic "1" value, then the ETT/P value is loaded into product register 1541. If the PS[0] bit has a logic "0" value, then the ETT/P value is not loaded into product register 1541 (i.e., product register 1541 continues to store a zero value). The contents of product register 1541 are provided to the B input terminal of adder 1531 as the P[18:0] signal.

After this first iteration, the PS[7:0] value is shifted to the right by one bit, such that register M0 provides the PS[1] bit to the load input terminal of product register 1541. Also after the first iteration, the ETT/P value stored in register M1 is shifted to the left by one bit by routing this value through the left-shifting input terminal of multiplexer 1506 and multiplexers 1503-1504. This left-shifted ETT/P value is loaded into register M1. Adder 1531 then provides an output equal to the sum of the left shifted ETT/P value and the contents of product register 1541. If the PS[1] bit has a logic "1" value, then the output of adder 1531 is loaded into product register 1541. If the PS[1] bit has a logic "0" value, then the output of adder 1531 is not loaded into product register 1541, and the contents of product register 1541 remain unchanged.

This process is repeated, with the ETT/P value stored in register M1 being shifted left and the PS[7:0] signal in register M0 being shifted right on each iteration. The process is completed when bits M0[7:1] all have logic "0" values. At this time, product register 1541 holds a value equal to ETT/P×PS_MAG (see equations (8), (9), (10)). If either one of bits P[18:17] provided by product register 1541 has a logic "1" value, then an overflow condition exists. Under these conditions, OR gate 1542 provides a logic high OVERFLOW signal, and product register 1541 is prevented from changing state until the MULTIPLY state is exited.

After the MULTIPLY state is complete, the primary state machine enters a PASS state. During the PASS state, bias adder/subtractor 1532 is allowed time to complete an add or subtract operation. Bits P[16:8] of product register 1541 are provided to the "A" input terminal of bias adder/subtractor 1532, thereby right shifting the contents of product register 1541 by 8 bits. This effectively divides the contents of product register by 256 (see equations (8), (9), (10)). The "B" input terminal of bias adder/subtractor 1532 is coupled to receive a value of either "0" (if CENTERED=0) or 256 (if CENTERED=1). Bias adder/subtractor 1532 will perform an addition (B+A) if AND gate 1543 provides a logic "0" output signal. Conversely, bias adder/subtractor 1532 will perform a subtraction (B−A) if AND gate 1543 provides a logic "1" output signal. AND gate 1543 only provides a logic "1" signal if delay lock loop 400 is configured in the variable mode (CENTERED=1), and up/down signed counter 1511 has a negative value (SIGN=1). If bit R[9] of bias adder/subtractor 1532 has a logic "1" value, OR gate 1542 will assert the OVERFLOW signal, thereby indicating that an overflow condition exists. As long as the OVERFLOW signal is not asserted, the result R[8:0] provided by bias adder/subtractor 1532 represents the desired PS_TT[8:0] signal.

Note that the OVERFLOW signal can be set due to any of the following: (a) the value provided by product register 1541 is not between 0 and 1FFFF, inclusive, (b) the R[8:0] output of bias adder/subtractor 1532 is not between 0 and 1FF, inclusive (c) tap/trim counter 1311 would wrap if changed in the selected direction, and (d) up/down counter 1511 would wrap if changed in the selected direction.

After the PASS state is complete, the primary state machine enters an ADJUST_PSTT state. In this state, the PS_TT[8:0] signal is set equal to the result R[8:0] provided by bias adder/subtractor 1532. The "A" input terminal of comparator 1533 is coupled to receive the result R[8:0] of bias adder/subtractor 1532. The "B" input terminal of comparator 1533 is coupled to receive the PS_TT[8:0] signal from up/down counter 1311. Comparator 1533 provides logic high signal to the clock enable input terminal (CE) of up/down counter 1311 if the R[8:0] signal is not equal to the PS_TT[8:0] signal, thereby enabling up/down counter 1311. Comparator 1533 also provides a logic high signal to the UP terminal of up/down counter 1311 if the PS_TT[8:0] signal is less than the R[8:0] signal. Conversely, logic block 1533 provides a logic low signal to the UP terminal of up/down counter 1311 if the PS_TT[8:0] signal is greater than or equal to the R[8:0] signal. Up/down counter 1311 is incremented by one if the UP terminal receives a logic "1" signal, and is decremented by one if the UP terminal receives a logic "0" signal. Upon RESET, up/down counter 1311 is reset to a logic zero value. Consequently, up/down counter 1311 will adjust the PS_TT[8:0] value until this value is equal to the R[8:0] value (or until overflow occurs). When the PS_TT[8:0] signal is equal to the R[8:0] signal, or OVERFLOW is true, control logic 1550 sets the DONE signal. Control logic 1550 sets the PS_LOCKED signal the first time the DONE signal is asserted after RESET. The PS_LOCKED signal informs DLL control 1312 that the phase shift logic 1310 has been properly initialized. An exception is during the locking process, where the DONE signal is not set if OVERFLOW is true, so the PS_LOCKED signal will not set either.

The primary state machine then enters the WT_GONOT state, in which the state machine waits until the GO signal is inactive, and then enters the IDLE state.

External user interface 1320 is provided to allow dynamic changes to the phase shift (i.e., the fraction numerator of equations (8), (9), (10)) during normal operation. The user may increment or decrement the fraction numerator. In the variable modes, the fraction numerator may cross from positive through zero to negative, and vice-versa. External user interface 1320 is synchronous with the external clock signal PSCLK. Note that the rest of the clocked elements of phase shift control circuit 1310 are clocked by the PS_DLY_OUT clock signal. The module uses standard techniques to cross from the PSCLK domain to the PS_DLY_OUT clock domain and vice-versa.

A second state machine, namely, a dynamic phase change (DPS) state machine, controls user interface 1320. Running in the PS_DLY_OUT clock domain, the DPS state machine also ensures that changes are made to the signed up/down counter 1511 only when this counter is not being used by the primary state machine. After the DPS state machine is started, control proceeds to the next state after one clock cycle, unless otherwise noted in the description below.

The DPS state machine starts in a DPS_IDLE state, wherein the state machine waits for the PSEN signal to be asserted. Upon detecting the PSEN signal (as clocked in by the PSCLK signal), the DPS state machine will proceed to the next state. However, to avoid logical discontinuity, the DPS_IDLE state cannot be exited unless the primary state machine is in the IDLE state.

The DPS state machine then enters a DPS_CNTR state, in which counter 1511 is incremented if the captured PSINCDEC signal has a logic "1" value, and decremented if the captured PSINCDEC signal has a logic "0" value.

The DPS state machine then enters a DPS_W_ADJUST_PSTT state, in which the DPS state machine waits until the primary state machine completes a corresponding adjustment cycle. The DPS state machine remains in this state until the exit conditions for the primary state ADJUST_PSTT are true.

The DPS state machine then enters a DPS_SETDONE state, in which the PSDONE signal (which is coupled to the PSCLK domain) is set. The asserted PSDONE signal informs the user that the requested phase change has been completed. Processing then returns to the DPS_IDLE state.

In the foregoing manner, digital phase shifter 1100 is capable of precisely modifying the delay between the REF_CLK and S_CLK signals. This operation is controlled to compensate for low frequency and high frequency signals, as well as for variations in temperature. Advantageously, the phase can be modified both automatically and under user control.

As described above, the equivalent taps per period ETT/P must be determined in order to provide a precise phase shift within delay lock loop 400 (FIG. 11). The equivalent taps per period ETT/P allows the user to specify a desired phase shift in terms of percentage of clock period. As described above in Equations (6) and (7), when determining the equivalent taps per period ETT/P, a high frequency constant HFC[7:0] or a low frequency constant LFC[7:0] is used to represent the overhead of the signal path through the delay chain located in clock phase shifter 350. The high frequency constant HFC[7:0] and low frequency constant LFC[7:0] are typically determined by a SPICE simulation, and then hardwired into the chip design. Because of process, voltage and temperature changes, the hardwired constants HFC[7:0] and LFC[7:0] may not track the actual overhead of the signal path, which results in an inaccurate phase shift, and may cause many silicon iterations.

Thus, in accordance with another embodiment of the present invention, an automatic calibration scheme is provided, which calibrates the equivalent taps per period ETT/P every time DLL 400 is used. More specifically, digital phase shifter 1100 is modified to measure equivalent taps per period ETT/P. Alternately, digital phase shifter 1100 can be modified to directly measure the signal delay through the delay chain located in clock phase shifter 350, thereby directly determining the constants LFC[7:0] and HFC[7:0].

Figure 16A:
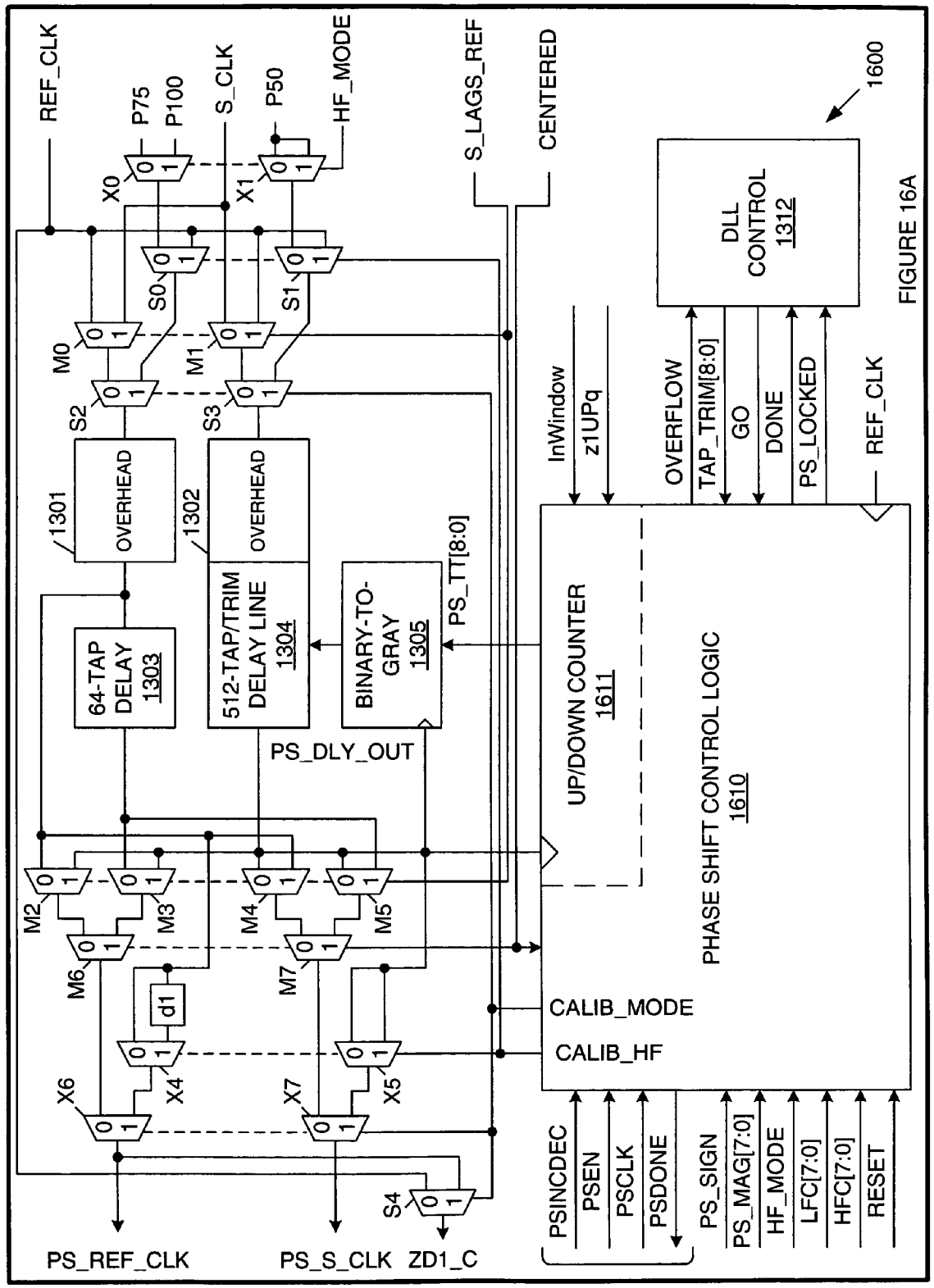
FIG. 16A is a block diagram of a digital phase shifter in accordance with one embodiment of the present invention.

FIG. 16A is a block diagram of digital phase shifter 1600 in accordance with one embodiment of the present invention. Because digital phase shifter 1600 (FIG. 16A) is similar to digital phase shifter 1100 (FIG. 13), similar elements in FIGS. 16A and 13 are labeled with similar reference numbers. Thus, digital phase shifter 1600 includes multiplexers M0-M7, overhead delay circuits 1301-1302, 64-tap delay circuit 1303, adjustable 512-tap/trim delay line 1304, binary-to-gray decoder 1305, and DLL control circuitry 1312, which have been described above.

In addition, digital phase shifter 1600 includes multiplexers X0-X7, multiplexers S0-S4, and phase shift control logic 1610 (which includes up/down counter 1611). Multiplexers S0-S4 are special clock switch multiplexers. That is, multiplexers S0-S4 are glitch free clock multiplexers, which guarantee no runt clock pulses are generated during multiplexer switching.

Figure 16B:
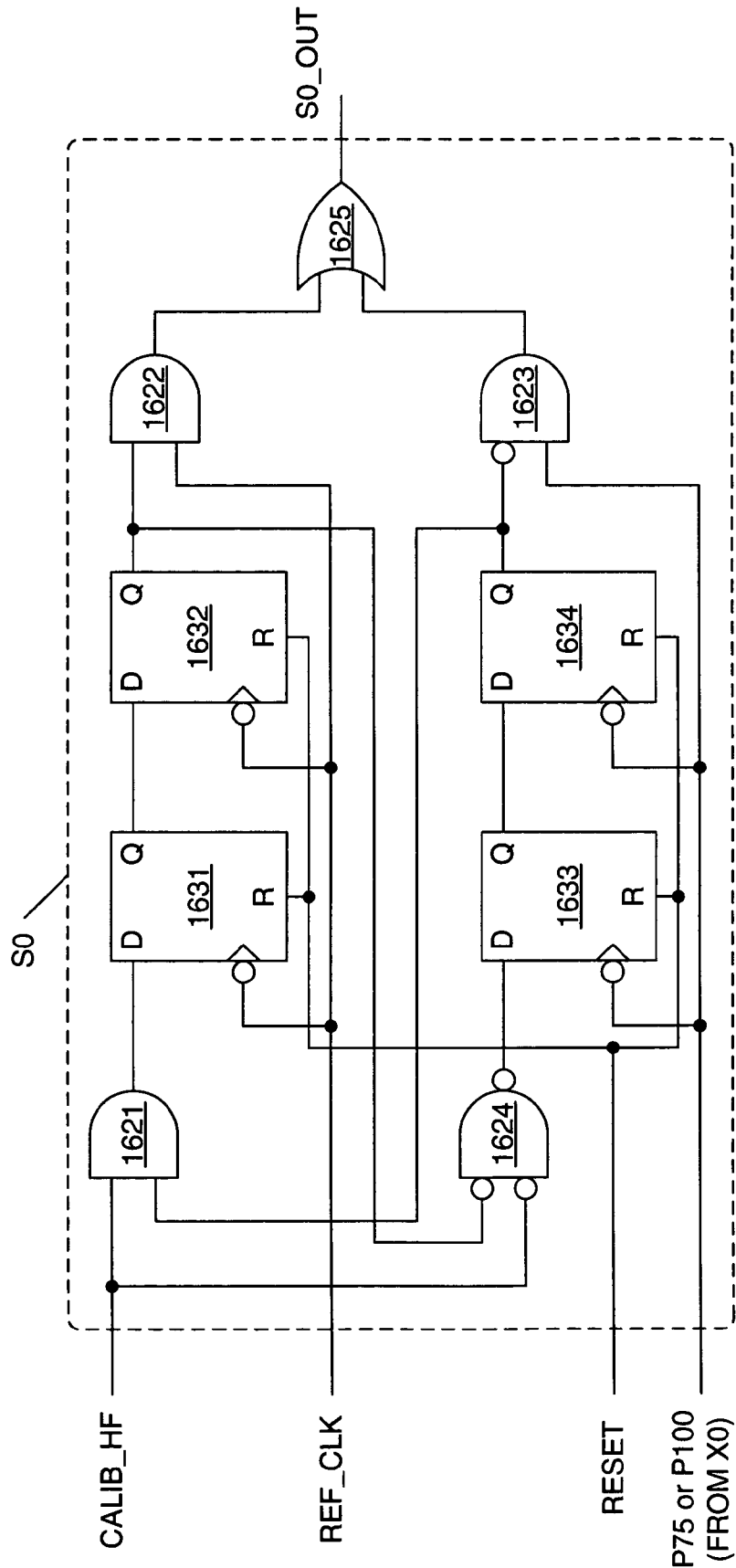
FIG. 16B is a circuit diagram of a glitchless clock multiplexer used in one embodiment of the present invention.

FIG. 16B is a circuit diagram of multiplexer S0 in accordance with one embodiment of the present invention. Multiplexer S0 includes AND gates 1621-1623, NAND gate 1624, OR gate 1625 and D-Q flip-flops 1631-1634. Flip-flops 1631-1634 are initially reset in response to the reset control signal, RESET. As a result, flip-flops 1631-1634 initially provide logic "0" output signals. The logic "0" signal provided by flip-flop 1632 causes AND gate 1622 to provide a logic "0" value to OR gate 1625. The logic "0" value provided by flip-flop 1634 causes AND gate 1623 to provide the P75 (or P100) signal to OR gate 1625. In response, OR gate 1625 provides the P75 (or P100) signal as the output S0_OUT of multiplexer S0.

If the CALIB_HF signal initially has a logic "0" state, then NAND gate 1624 will provide a logic "0" signal to flip-flop 1633, and AND gate 1621 will initially provide a logic "0" value to flip-flop 1631. The P75 (or P100) clock signal will clock the logic "0" signal provided by NAND gate 1624 through flip-flops 1633 and 1634. Thus, the logic "0" signal initially provided by flip-flop 1634 remains unchanged. The REF_CLK signal will clock the logic "0" signal provided by AND gate 1621 through flip-flops 1631 and 1632. Thus, the logic "0" signal initially provided by flip-flop 1632 also remains unchanged. As a result, the P75 (or P100) signal continues to be routed as the output signal S0_OUT.

If the CALIB_HF signal transitions to a logic "1" state at any time, the output clock signal S0_OUT will synchronously switch from the P75 (or P100) clock signal to the REF_CLK signal in the following manner. The logic "1" state of the CALIB_HF signal causes NAND gate 1624 to provide a logic "1" output signal, which is clocked through flip-flops 1633 and 1634 in response to the P75 (or P100) signal. When the logic "1" signal appears at the output of flip-flop 1634, AND gate 1623 provides a logic "0" value to OR gate 1625, thereby forcing the S0_OUT signal to a logic "0" state.

The logic "1" signal provided by flip-flop 1634 also causes AND gate 1621 to provide a logic "1" signal to flip-flop 1631. This logic "1" signal is clocked through flip-flops 1631 and 1632 in response to the REF_CLK signal. When the logic "1" signal appears at the output of flip-flop 1632, AND gate 1622 effectively routes the REF_CLK signal to OR gate 1625. In response, OR gate 1625 routes the REF_CLK signal as the S0_OUT signal, thereby completing the switching operation of multiplexer S0.

When switched, the S0_OUT signal will be low for at least one period of the new clock signal, thereby eliminating glitches. Note that the P75 (or P100) clock signal and the REF_CLK signal can be asynchronous. Also note that the CALIB_HF signal does not need to be synchronous with respect to either input clock signal REF_CLK or P75 (or P100).

Returning now to FIG. 16A, phase shift control logic 1610 includes all of the functionality of phase shift control logic 1310 (FIG. 13), plus some additional functions, which are described in more detail below. Similarly, up/down counter 1611 includes all of the functionality of up/down counter 1311, plus some additional functions, which are described below. As will become apparent in view of the following disclosure, tap/trim delay line 1304 must be able to introduce a delay at least as large as a quarter period of the REF_CLK signal at the minimum operating frequency at the fast-fast (FF) corner.

Multiplexers M0 and M1 are coupled to receive the REF_CLK signal and the S_CLK signal in the manner described above (FIG. 13). The output terminals of multiplexers M0 and M1 are coupled to logic "0" input terminals of multiplexers S2 and S3, respectively. Multiplexers S2 and S3 are controlled by a calibration mode enable signal (CALIB_MODE) provided by phase shift control logic 1610. During normal operation, the CALIB_MODE signal has a logic "0" value, thereby causing the output signals provided by multiplexers M0 and M1 to be routed to overhead circuits 1301 and 1302, respectively, in the manner described above (FIG. 13).

Multiplexers M2-M7 are connected in the manner described above (FIG. 13). The output terminals of multiplexers M6 and M7 are coupled to logic "0" input terminals of multiplexers X6 and X7, respectively. Multiplexers X6 and X7 are controlled by the CALIB_MODE signal. During normal operation, the CALIB_MODE signal has a logic "0" value, thereby causing the output signals provided by multiplexers M6 and M7 to be routed as the PS_REF_CLK and PS_S_CLK signals, respectively, in the manner described above (FIG. 13).

The logic "0" and logic "1" input terminals of multiplexer X0 are coupled to receive clock signals P75 and P100, respectively. Clock signal P75 is provided by multiplexer 730_3 of FIG. 7. Thus, clock signal P75 is a phase shifted version of the REF_CLK signal, which leads the REF_CLK signal by 0.75 period or 270°. Clock signal P100 is provided by multiplexer 730_4 of FIG. 7. Thus, clock signal P100 is a phase shifted version of the REF_CLK signal, which leads the REF_CLK signal by 1 period or 360°.

The logic "0" and logic "1" input terminals of multiplexer X1 are commonly coupled to receive the clock signal P50. Clock signal P50 is provided by multiplexer 730_2 of FIG. 7. Thus, clock signal P50 is a phase shifted version of the REF_CLK signal, which leads the REF_CLK signal by 0.50 period or 180°.

Multiplexers X0 and X1 are controlled by the HF_MODE signal, which is described above in connection with phase shift control logic 1310. When the HF_MODE signal has a logic "0" value (indicating low frequency operation), multiplexers X0 and X1 pass the P75 and P50 clock signals, respectively. Conversely, when the HF_MODE signal has a logic "1" value (indicating low frequency operation), multiplexers X0 and X1 pass the P100 and P50 clock signals, respectively.

The output terminals of multiplexers X0 and X1 are coupled to the logic "0" input terminals of multiplexers S0 and S1, respectively. The logic "1" input terminals of multiplexers S1 and S1 are coupled to receive the REF_CLK signal. Multiplexers S0 and S1 are controlled by a high frequency calibration enable signal (CALIB_HF) provided by phase shift control logic 1610. The CALIB_HF signal is described in more detail below.

The output terminals of multiplexers S0 and S1 are coupled to the logic "1" input terminals of multiplexers S2 and S3, respectively. When the CALIB_MODE signal has a logic "1" value, multiplexers S2 and S3 route the signals provided on the output terminals of multiplexers S0 and S1 to overhead circuits 1301 and 1302, respectively.

The logic "0" input terminal of multiplexer X4 is coupled to the output terminal of overhead circuit 1301. Similarly, the logic "1" input terminal of multiplexer X4 is coupled to the output terminal of overhead circuit 1301 through a small delay circuit d1. The logic "0" and "1" input terminals of multiplexer X5 are commonly coupled to receive the PS_DLY_OUT signal from 512 tap/trim delay line 1304. Multiplexers X4 and X5 are controlled by the CALIB_HF signal provided by phase shift control logic 1610.

The logic "1" input terminal of multiplexer X6 is coupled to the output terminal of multiplexer X4. The logic "1" input terminal of multiplexer X7 is coupled to the output terminal of multiplexer X5. As described above, multiplexers X6 and X7 are controlled by the CALIB_MODE signal provided by phase shift control logic 1610.

The logic "0" input terminal of multiplexer S4 is coupled to receive the REF_CLK signal, and the logic 1111 input terminal of multiplexer S4 is coupled to the output terminal of multiplexer X6. Multiplexer S4 is controlled by the CALIB_MODE signal provided by phase shift control logic 1610.

Figure 17A:
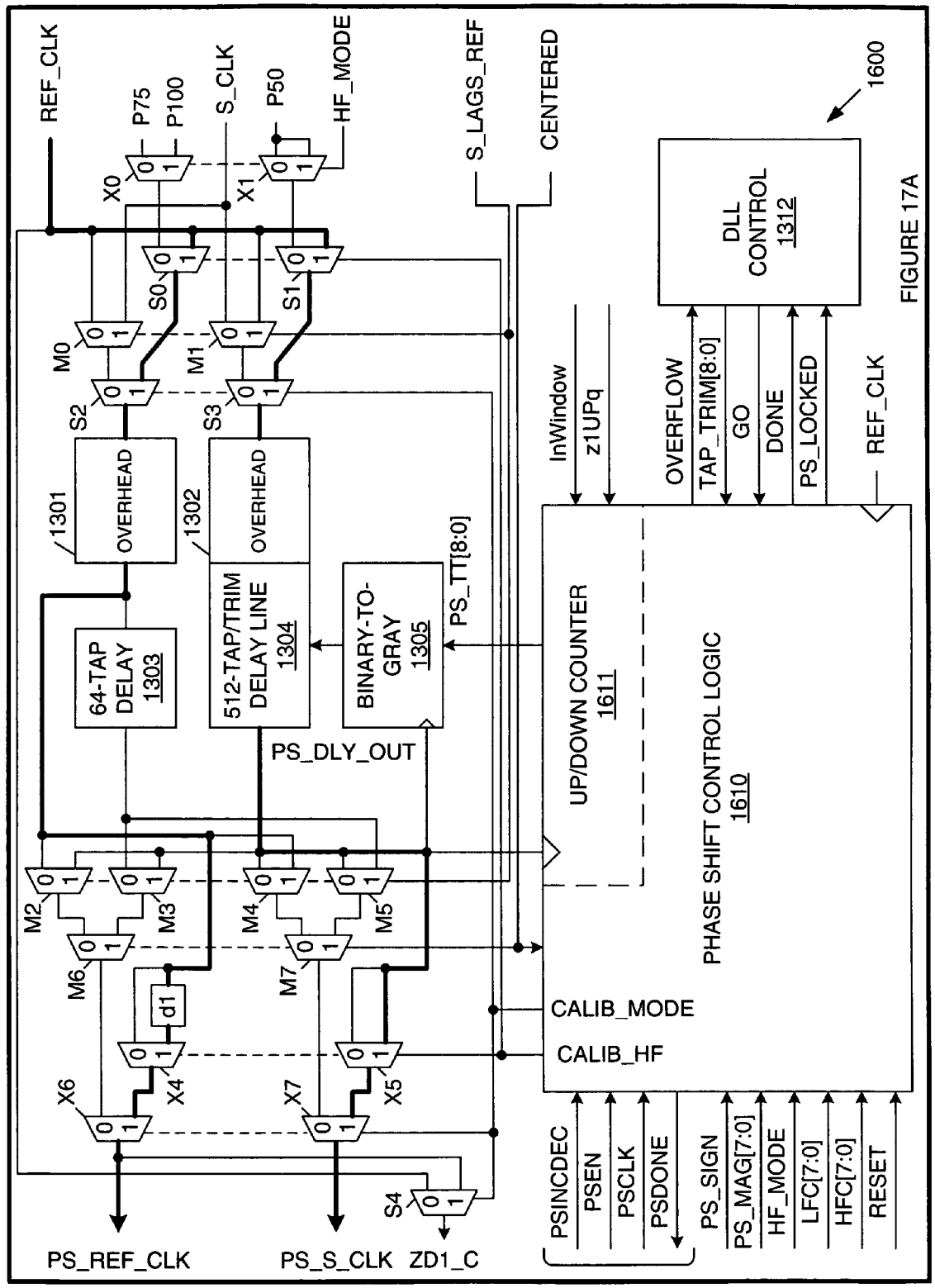
FIGS. 17A, 17B and 17C are block diagrams of the digital phase shifter of FIG. 16A, wherein signal paths are highlighted to illustrate various steps of an automatic calibration process.

Phase detector 320 (FIG. 11) is configured to provide a pair of control signals InWindow and zlupq to up/down counter 1611. Phase detector 320 activates the Inwindow signal when PS_REF_CLK and PS_S_CLK are within certain amount of delay, i.e. 300 ps, thereby indicating that the zlupq signal is valid. Phase detector 320 activates the zlupq signal high when the REF_CLK signal leads the S_CLK signal, and deactivates the zlupq signal low when the REF_CLK signal lags the S_CLK signal. Digital phase shifter 1600 operates as follows. The RESET signal is initially activated. In response, phase shift control logic 1610 resets up/down counter 1611, such that the 512 tap/trim delay line 1304 is set to the minimum delay. Phase shift control logic 1610 further activates the CALIB_MODE and CALIB_HF signals to logic "1" states. Under these conditions, the REF_CLK signal is routed through two paths. The first path includes multiplexer S0 and S2, overhead 1301, delay element d1, and multiplexers X4 and X6. The second path includes multiplexer S1 and S3, overhead 1302, and multiplexers X5 and X7. FIG. 17A is a block diagram of digital phase shifter 1600, with these two paths highlighted with bold lines. The only difference between these two paths is the presence of delay element d1 in the first path. Delay element d1 introduces a small delay (e.g., one tap delay) to the first path, thereby ensuring that the PS_S_CLK signal initially leads the PS_REF_CLK signal. As a result, the S_LAGS_REF control signal is deactivated to a logic "0" value.

Clock phase shifter 350 is then allowed to lock, such that the D_CLK signal is synchronized with the clock signal provided by multiplexer 730_4 (FIG. 7). At this time, the delay introduced by delay lines 710_1-710-4 is equal to one period of the REF_CLK signal. The TAP_TRIM[8:0] value provided by DLL control circuit 1312 is stored as the initial clock phase shifter tap/trim lock value, ZD2_TTV1.

Phase shift control logic 1610 then increases the tap/trim value PS_TT[8:0] thereby increasing the delay introduced by 512 tap/trim delay line 1304. When the delay introduced by 512 tap/trim delay line 1304 exceeds the delay introduced by delay element d1, the S_LAGS_REF signal transitions to a logic "1" value. Phase shift control logic 1610 saves the tap/trim value PS_TT[8:0] at which this transition occurs, as the first tap/trim value $PS\_TT_1[8:0]$ Phase shift control logic 1610 continues to increase the tap/trim value PS_TT[8:0], thereby further increasing the delay introduced by 512 tap/trim delay line 1304. If the additional delay introduced by 512 tap/trim delay line 1304 exceeds the period of the REF_CLK signal, the S_LAGS_REF signal transitions to a logic "0" value. Phase shift control logic 1610 saves the tap/trim value PS_TT[8:0] at which this transition occurs, as the second tap/trim value $PS\_TT_2[8:0]$. Phase shift control logic 1610 resets up/down counter 1611, thereby resetting the 512 tap/trim delay line 1304 to the minimum delay. Phase shift control logic 1610 calculates the initial ETT/P value (ETT/P_INIT) by subtracting the first tap/trim value $PS_1\_TT[8:0]$ from the second tap/trim value $PS_2\_TT[8:0]$. Phase shift control logic 1610 then asserts an ETT/P_LOCKED control signal, thereby indicating that ETT/P was successfully calculated. In the foregoing manner, digital phase shifter 1600 automatically calculates the equivalent tap/trim per period ETT/P of the REF_CLK signal.

If phase shift control logic 1610 increments 512 tap/trim delay line 1304 to the maximum delay, but the S_LAGS_REF signal does not transition back to a logic "0" value, processing proceeds as follows. The failure of the S_LAGS_REF signal to transition back to a logic "0" value is (most likely) caused by the period of the REF_CLK signal exceeding the maximum delay of 512 tap/trim delay line 1304. That is, the failure of the S_LAGS_REF signal to transition back to a logic "0" value indicates that the REF_CLK signal is a low frequency (high period) signal.

In this case, phase shift control logic 1610 also decrements up/down counter 1611 to a zero count, such that 512 tap/trim delay line 1304 introduces the minimum delay. After allowing the delay line 1304 to settle for a few cycles, phase shift control logic 1610 sets the CALIB_HF signal to a logic "0" value. The logic "0" CALIB_HF signal causes multiplexers S0 and S1 to route the clock signals received from multiplexers X0 and X1, respectively. If the HF_MODE signal has a logic "0" signal (thereby indicating a low frequency mode), multiplexers X0 and X1 will route the P75 and P50 clock signals, respectively, to multiplexers S0 and S1, respectively.

Figure 17B:
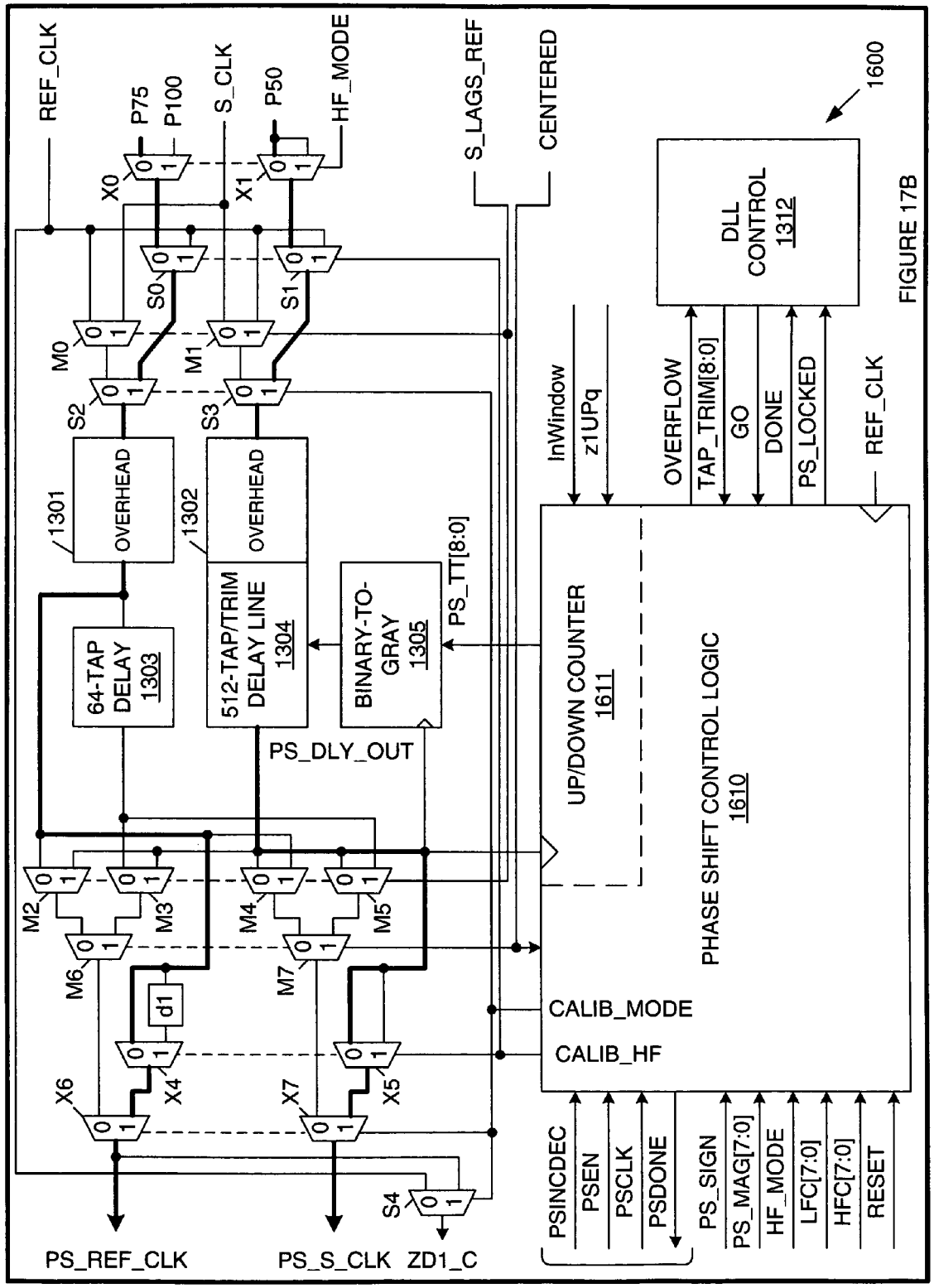

The logic "0" CALIB_HF signal also causes multiplexers X4 and X5 to route the signals provided by overhead circuit 1301 and 512 tap/trim delay line 1304, respectively. Thus, the P75 and P50 clock signals are routed on two separate paths. The first path includes multiplexers X0, S0 and S2, overhead 1301, and multiplexers X4 and X6. The second path includes multiplexers X1, S1 and S3, overhead 1302, tap/trim delay line 1304, and multiplexers X5 and X7. FIG. 17B is a block diagram of digital phase shifter 1600, with these two paths highlighted with bold lines.

Initially, the P50 clock signal leads the P75 clock signal by ¼ period of the REF_CLK signal. Thus, the S_LAGS_REF signal has a logic "0" value. Phase shift control logic 1610 increments the delay of tap/trim delay line 1304 until the S_LAGS_REF signal transitions to a logic "1" value, thereby indicating that the P50 clock signal lags the P75 clock signal. At this time, phase shift control logic 1610 saves the associated count value PS_TT[8:0] as the third count value $PS\_TT3[8:0]$. Because this third count value $PS_3\_TT[8:0]$ is representative of ¼ period of the REF_CLK signal, phase shift control logic 1610 multiplies the third count value $PS_3\_TT$ by four in order to calculate the initial ETT/P value, ETT/P_INIT.

Figure 17C:
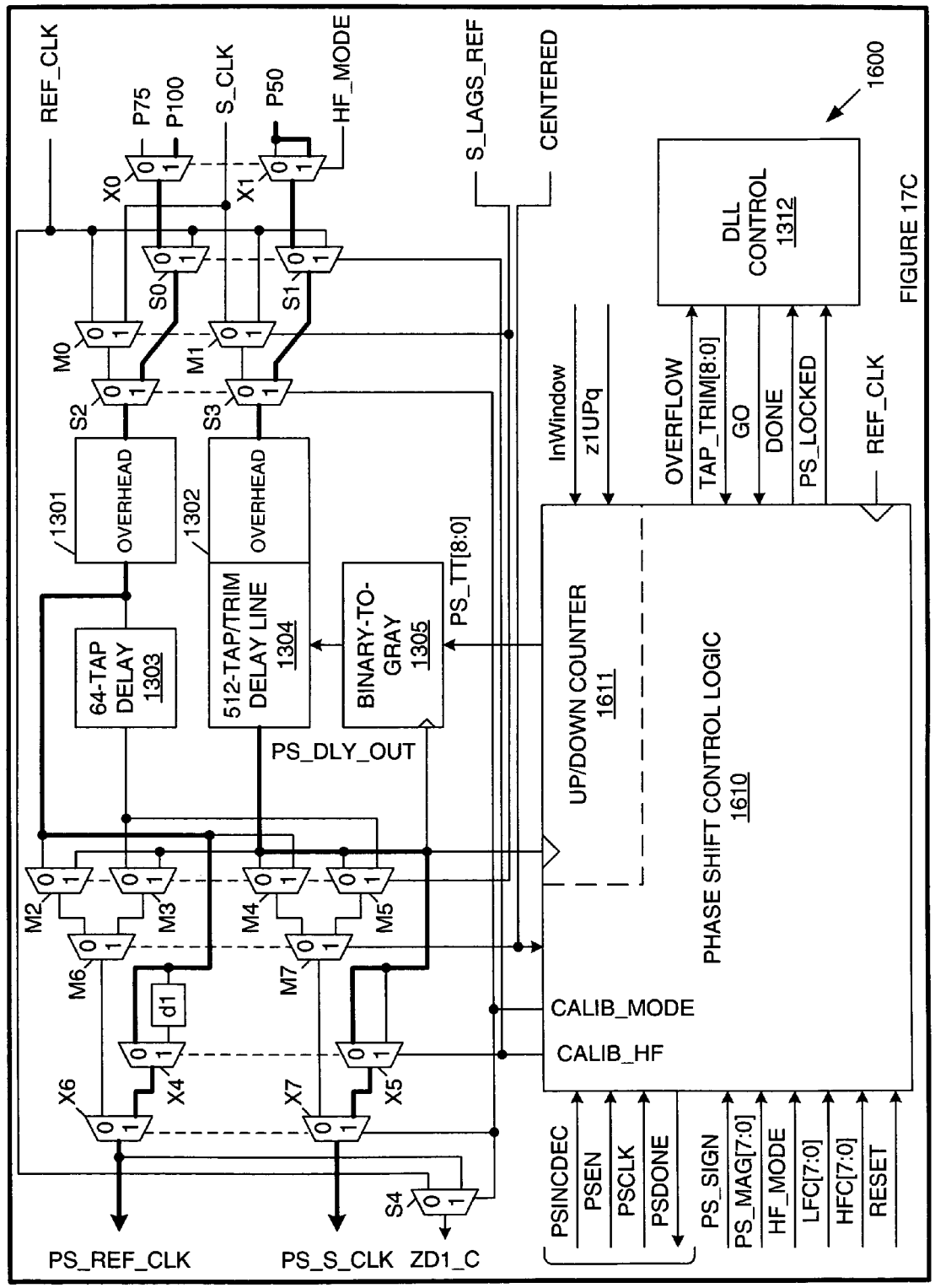

Note that if the HF_MODE signal has a logic "1" signal (thereby indicating a high frequency mode), multiplexers X0 and X1 will route the P100 and P50 clock signals, respectively, thereby creating two different signal paths through digital phase shifter 1600. FIG. 17C is a block diagram of digital phase shifter 1600, which illustrates these two clock signal paths with bold lines. In this case, the P50 clock signal initially leads the P100 clock signal by ½ period of the REF_CLK signal. Thus, the S_LAGS_REF signal has a logic "0" value. Phase shift control logic 1610 increments the delay of tap/trim delay line 1304 until the S_LAGS_REF signal transitions to a logic "1" value, thereby indicating that the P50 clock signal lags the P100 clock signal. At this time, phase shift control logic 1610 saves the associated count value PS_TT[8:0] as the third count value $PS\_TT_3[8:0]$. Because this third count value $PS_3\_TT[8:0]$ is representative of ½ period of the REF_CLK signal, phase shift control logic 1610 multiplies the third count value $PS_3\_TT$ by two in order to calculate the initial ETT/P value, ETT/P_INIT.

After the initial ETT/P value (ETT/P_INIT) has been calculated, the ETT/P value can be dynamically adjusted to compensate for changing system conditions. Thus, phase shift control logic 1610 continuously samples the tap/trim value TAP_TRIM[8:0] associated with the total delay introduced by clock phase shifter 350. Phase shift control logic 1610 subtracts the initial tap/trim lock value of clock phase shifter 350 (i.e., ZD2_TTV1) from the new tap/trim lock value of clock phase shifter 350 (i.e., ZD_TTV2) to determine the change in the ETT/P value (ETT/P_delta). Phase shift control logic 1610 then adds this ETT/P_delta value to the initial ETT/P value (ETT/P_INIT) to determine the new ETT/P value. This process is repeated to maintain an accurate ETT/P value.

Because ETT/P is measured directly, the HFC and LFC constants are not required in the present embodiment.

In an alternate embodiment, the measurement process can be sped up as follows. When the CALIB_HF signal has a logic "1" state, tap/trim delay line 1304 is advanced in small trim increments until the S_LAGS_REF signal transitions to a logic "1" state. At this time, tap/trim delay line 1304 is advanced in larger tap increments until phase detector 320 activates the InWindow control signal. At this time, tap/trim delay line 1304 is advanced in the smaller trim increments until the S_LAGS_REF signal transitions to a logic "0" state. Using fine adjustments near the endpoints and coarse adjustments at the midpoint results in a faster calculation of the ETT/P value. A similar scheme can be used when the CALIB_HF signal has a logic "0" state, and when up/down counter 1611 is being decremented.

Figure 18:
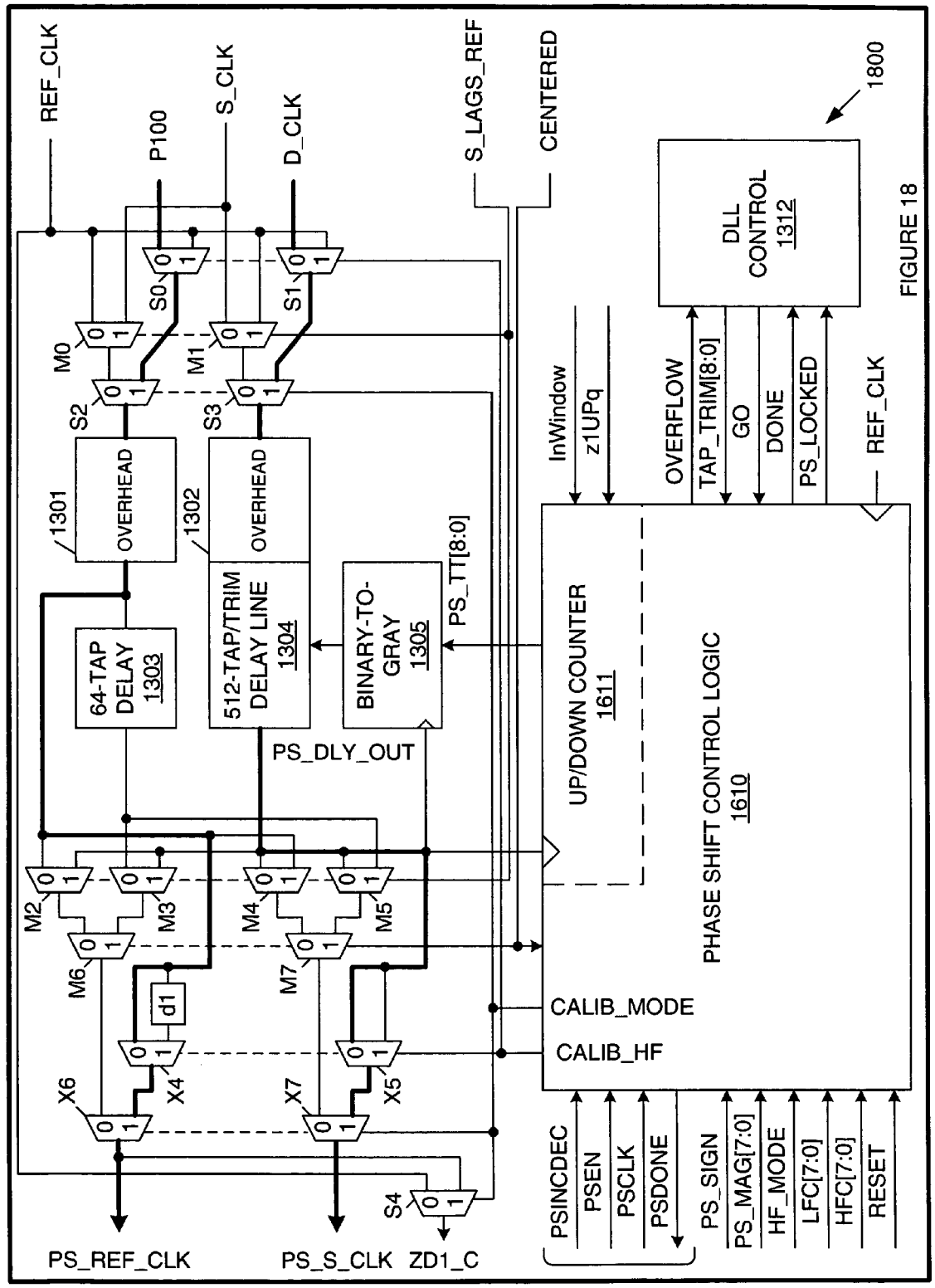
FIG. 18 is a block diagram of a digital phase shifter in accordance with another embodiment of the present invention.

FIG. 18 is a block diagram of a digital phase shifter 1800 in accordance with another embodiment of the present invention. In this embodiment, multiplexers X0 and X1 of digital phase shifter 1600 are eliminated, the P100 signal provided by clock phase shifter 350 is applied to the logic "0" input terminal of multiplexer S0, and the D_CLK signal (FIG. 11) is applied to the logic "0" input terminal of multiplexer S1. The CALIB_HF signal has a logic "0" state and the CALIB_MODE signal is activated to a logic "1" state, such that the D_CLK and P100 signals follow the highlighted paths in FIG. 18.

Initially, clock phase shifter 350 is reset to a minimum delay, and is not allowed to lock. As a result, the P100 signal is equal to the D_CLK signal plus the overhead associated with clock phase shifter 350.

Tap/trim delay line 1304 is also initially reset to a minimum delay. Digital phase shifter 1800 is then allowed to synchronize the PS_REF_CLK and PS_S_CLK signals by introducing the required delay with tap/trim delay line 1304. When digital phase shifter 1800 is locked, tap/trim delay line 1304 introduces a delay equal to the overhead associated with clock phase shifter 350. The tap/trim setting PS_TT[8:0] associated with this delay is saved as the HFC[8:0] (or LFC[8:0]) value. In the foregoing manner, digital phase shifter 1800 is enabled to directly measure the HFC[8:0] or LFC[8:0] value. Advantageously, this method will track process changes.

The present embodiment advantageously requires a low amount of custom logic and provides a high accuracy. In addition, clock multiplexers S0-S4 eliminate the worry of clock glitches when switching the CALIB_MODE and CALIB_HF signals, thereby facilitating glitch analysis.

Although the invention has been described in connection with several embodiments, it is understood that this invention is not limited to the embodiments disclosed, but is capable of various modifications which would be apparent to a person skilled in the art. For example, in view of this disclosure those skilled in the art can define other clock phase shifters, delay lines, output generators, controllers, phase detectors, and so forth, and use these alternative features to create a method, circuit, or system according to the principles of this invention. Thus, the invention is limited only by the following claims.

We claim:

1. A method of automatically determining equivalent delay elements per period of a reference clock signal, the method comprising:
   routing the reference clock signal through a first path having a first delay, thereby creating a first delayed clock signal;
   routing the reference clock signal through a second path having a second delay, less than the first delay, thereby creating a second delayed clock signal that initially leads the first delayed clock signal;
   incrementally introducing delay elements to the second path until the first delayed clock signal leads the second delayed clock signal at a first time;
   incrementally introducing delay elements to the second path until the second delayed clock signal leads the first delayed clock signal at a second time; and
   determining a total number of delay elements introduced to the second path between the first time and the second time.

2. The method of claim 1, further comprising using the number of delay elements determined to identify an equivalent number of delay elements per period of the reference clock signal.

3. The method of claim 2, further comprising subsequently introducing a phase shift to the reference clock signal, wherein the phase shift is defined with respect to the equivalent number of delay elements per period of the reference clock signal.

4. A method of automatically determining equivalent delay elements per period of a reference clock signal, the method comprising:
   routing a first clock signal having a first phase relationship with respect to the reference clock signal through a first path having a first delay, thereby creating a first delayed clock signal;
   routing a second clock signal having a second phase relationship with respect to the reference clock signal through a second path having the first delay, thereby creating a second delayed clock signal;
   incrementally introducing delay elements to the second path until the first delayed clock signal is synchronous with the second delayed clock signal;
   determining a total number of delay elements introduced to the second path to synchronize the first delayed clock signal and the second delayed clock signal; and
   using the number of delay elements determined to identify an equivalent number of delay elements per period of the reference clock signal.

5. The method of claim 4, further comprising subsequently introducing a phase shift to the reference clock signal, wherein the phase shift is defined with respect to the equivalent number of delay elements per period of the reference clock signal.

6. The method of claim 4, wherein the first clock signal and the second clock signal exhibit a phase difference that corresponds with one half period of the reference clock signal.

7. The method of claim 4, wherein the first clock signal and the second clock signal exhibit a phase difference that corresponds with one quarter period of the reference clock signal.

8. A method of determining a delay overhead associated with a clock phase shifter of a delay lock loop, the method comprising:
   routing a reference clock signal through a first path having a first delay, thereby creating a first delayed clock signal;
   routing the reference clock signal through the clock phase shifter and a second path having the first delay, thereby creating a second delayed clock signal;
   incrementally introducing delay elements to the first path until the first delayed clock signal is synchronous with the second delayed clock signal; and
   determining a total number of delay elements introduced to the first path to synchronize the first delayed clock signal and the second delayed clock signal; and
   using the determined number of delay elements to derive the delay overhead of a delay chain in the clock phase shifter.

9. A delay lock loop comprising:
   means for routing a reference clock signal through a first path having a first delay, thereby creating a first delayed clock signal;
   means for routing the reference clock signal through a second path having a second delay, less than the first delay, thereby creating a second delayed reference clock signal that initially leads the first delayed clock signal;
   means for incrementally introducing delay elements to the second path;
   means for determining when a first number of delay elements introduced to the second path causes the first delayed reference clock signal to lead the second delayed clock signal;

means for determining when a second number of delay elements introduced to the second path causes the second delayed reference clock signal to lead the first delayed clock signal; and means for determining a number of delay elements that is the difference between the first and second numbers of delay elements.

10. The delay lock loop of claim 9, wherein the means for routing comprise multiplexer circuits.

11. The delay lock loop of claim 10, wherein at least one of the multiplexer circuits is a glitchless multiplexer circuit.

12. The delay lock loop of claim 9, wherein the means for incrementally introducing delay elements to the second path comprises an adjustable delay line coupled to a counter.

13. A delay lock loop comprising:
a clock phase shifter adapted to generate a first clock signal having a first phase relationship with respect to a reference clock signal and a second clock signal having a second phase relationship with respect to the reference clock signal;
means for routing the first clock signal through a first path having a first delay, thereby creating a first delayed clock signal;
means for routing the second clock signal through a second path having the first delay, thereby creating a second delayed clock signal;
means for incrementally introducing delay elements to the second path until the first delayed clock signal is synchronous with the second delayed clock signal; and
means for determining a total number of delay elements introduced to the second path to synchronize the first delayed clock signal and the second delayed clock signal.

14. The delay lock loop of claim 13, further comprising means for multiplying the determined number of delay elements by a predetermined multiplier to derive an equivalent number of delay elements per period of the reference clock signal.

15. The delay lock loop of claim 14, further comprising means for introducing a phase shift to the reference clock signal, wherein the phase shift is defined with respect to the equivalent number of delay elements per period of the reference clock signal.

16. The delay lock loop of claim 13, wherein the clock phase shifter is adapted to create a phase difference between the first clock signal and the second clock signal that corresponds with one half period of the reference clock signal.

17. The delay lock loop of claim 13, wherein the clock phase shifter is adapted to create a phase difference between the first clock signal and the second clock signal that corresponds with one quarter period of the reference clock signal.

18. A delay lock loop comprising:
means for routing a reference clock signal through a first path having a first delay, thereby creating a first delayed clock signal;
means for routing the reference clock signal through a clock phase shifter set to a minimum delay and a second path having the first delay, thereby creating a second delayed clock signal;
means for incrementally introducing delay elements to the first path until the first delayed clock signal is synchronous with the second delayed clock signal;
means for determining a total number of delay elements introduced to the first path to synchronize the first delayed clock signal and the second delayed clock signal; and
means for using the number of delay elements determined to identify an equivalent number of delay elements per period of the reference clock signal.

19. A delay lock loop comprising:
a first path configured to route a first clock signal with a first delay, thereby creating a first delayed clock signal;
a second path configured to route the first clock signal with a second delay, less than the first delay, thereby creating a second delayed clock signal;
a delay line configured to incrementally introduce delay elements to the second path until the first delayed clock signal is synchronous with the second delayed clock signal at a first time, and to continue to incrementally introduce delay elements to the second path until the first delayed clock signal is synchronous with the second delayed clock signal at a second time; and
a counter configured to identify the number of delay elements introduced to the second path from the first time to the second time.

20. The delay lock loop of claim 19, further comprising a third path configured to route the first clock signal with the second delay, thereby providing the first delayed clock signal.

21. The delay lock loop of claim 19, further comprising:
a clock phase shifter configured to provide a first phase-shifted clock signal and a second phase-shifted clock signal in response to the first clock signal;
a third path configured to route the first phase-shifted clock signal with a third delay, thereby creating a first delayed phase-shifted clock signal; and
a fourth path configured to route the second phase-shifted clock signal with a fourth delay, equal to the third delay, thereby creating a second delayed phase-shifted clock signal, wherein the delay line is configured to incrementally introduce delay elements to the fourth path until the first delayed phase-shifted clock signal is synchronous with the second delayed phase-shifted clock signal at a third time, and wherein the counter is configured to identify the number of delay elements introduced to the fourth path at the third time.

22. The delay lock loop of claim 21, wherein the second phase-shifted clock signal lags the first clock signal by 180 degrees.

23. The delay lock loop of claim 22, wherein the first phase-shifted clock signal lags the first clock signal by 270 degrees.

24. The delay lock loop of claim 22, wherein the first phase-shifted clock signal lags the first clock signal by 360 degrees.

* * * * *